(12) United States Patent
Kawakami et al.

(10) Patent No.: US 8,535,997 B2
(45) Date of Patent: Sep. 17, 2013

(54) WIRING STRUCTURE, THIN FILM TRANSISTOR SUBSTRATE, METHOD FOR MANUFACTURING THIN FILM TRANSISTOR SUBSTRATE, AND DISPLAY DEVICE

(75) Inventors: Nobuyuki Kawakami, Kobe (JP); Shinya Fukuma, Kobe (JP); Aya Miki, Kobe (JP); Mototaka Ochi, Kobe (JP); Shinya Morita, Kobe (JP); Yoshihiro Yokota, Kobe (JP); Hiroshi Goto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 230 days.

(21) Appl. No.: 12/999,034

(22) PCT Filed: Jul. 3, 2009

(86) PCT No.: PCT/JP2009/062213
§ 371 (c)(1),
(2), (4) Date: Dec. 14, 2010

(87) PCT Pub. No.: WO2010/001998
PCT Pub. Date: Jan. 7, 2010

(65) Prior Publication Data
US 2011/0121297 A1    May 26, 2011

(30) Foreign Application Priority Data

Jul. 3, 2008   (JP) ................................. 2008-174616
Mar. 19, 2009  (JP) ................................. 2009-068447

(51) Int. Cl.
*H01L 21/84* (2006.01)

(52) U.S. Cl.
USPC 438/164; 257/59; 257/E21.046; 257/E29.157

(58) Field of Classification Search
USPC .............. 257/59, 88, 751, E29.143, E29.157, 257/E21.046, E21.593; 438/154, 164
See application file for complete search history.

(56) References Cited

U.S. PATENT DOCUMENTS

| 5,514,909 A | 5/1996 | Yamamoto et al. |
| 6,033,542 A | 3/2000 | Yamamoto et al. |

(Continued)

FOREIGN PATENT DOCUMENTS

| CN | 1917219 A | 2/2007 |
| JP | 62 298168 | 12/1987 |

(Continued)

OTHER PUBLICATIONS

U.S. Appl. No. 13/286,284, filed Nov. 1, 2011, Gotoh, et al.

(Continued)

*Primary Examiner* — Matthew Landau
*Assistant Examiner* — Joseph C Nicely
(74) *Attorney, Agent, or Firm* — Oblon, Spivak, McClelland, Maier & Neustadt, L.L.P.

(57) ABSTRACT

Provided is a direct contact technology by which a barrier metal layer between a Cu alloy wiring composed of pure Cu or a Cu alloy and a semiconductor layer can be eliminated, and the Cu alloy wiring can be directly and surely connected to the semiconductor layer within a wide process margin. The wiring structure is provided with the semiconductor layer and the Cu alloy film composed of pure Cu or the Cu alloy on a substrate in this order from the substrate side. A laminated structure is included between the semiconductor layer and the Cu alloy film. The laminated structure is composed of an (N, C, F) layer, which contains at least one element selected from among a group composed of nitrogen, carbon and fluorine, and a Cu—Si diffusion layer, which contains Cu and Si, in this order from the substrate side. Furthermore, at least the one element selected from among the group composed of nitrogen, carbon and fluorine is bonded to Si contained in the semiconductor layer.

7 Claims, 11 Drawing Sheets

(56) References Cited

U.S. PATENT DOCUMENTS

| | | | |
|---|---|---|---|
| 6,096,438 | A | 8/2000 | Takagi et al. |
| 6,218,206 | B1 | 4/2001 | Inoue et al. |
| 6,252,247 | B1 | 6/2001 | Sakata et al. |
| 6,387,737 | B1 * | 5/2002 | Yamazaki et al. ............ 438/149 |
| 7,098,539 | B2 | 8/2006 | Gotoh et al. |
| 7,154,180 | B2 | 12/2006 | Gotoh et al. |
| 7,262,085 | B2 | 8/2007 | Gotoh et al. |
| 7,365,810 | B2 | 4/2008 | Gotoh et al. |
| 7,411,298 | B2 | 8/2008 | Kawakami et al. |
| 7,553,754 | B2 | 6/2009 | Gotoh et al. |
| 7,622,809 | B2 | 11/2009 | Gotoh et al. |
| 7,683,370 | B2 | 3/2010 | Kugimiya et al. |
| 7,724,328 | B2 * | 5/2010 | Kim et al. ..................... 349/114 |
| 7,781,767 | B2 | 8/2010 | Kawakami et al. |
| 7,803,238 | B2 | 9/2010 | Kugimiya et al. |
| 8,043,484 | B1 * | 10/2011 | Rozbicki .................. 204/192.33 |
| 2003/0047812 | A1 | 3/2003 | Hagihara et al. |
| 2004/0041958 | A1 | 3/2004 | Hwang et al. |
| 2004/0125257 | A1 | 7/2004 | Chae et al. |
| 2005/0074969 | A1 | 4/2005 | Kim et al. |
| 2006/0091792 | A1 | 5/2006 | Kugimiya et al. |
| 2006/0275618 | A1 * | 12/2006 | Kugimiya et al. ............ 428/469 |
| 2007/0040172 | A1 * | 2/2007 | Kawakami et al. ............ 257/59 |
| 2007/0148456 | A1 | 6/2007 | Shim et al. |
| 2007/0295963 | A1 | 12/2007 | Yano et al. |
| 2008/0009107 | A1 * | 1/2008 | Tsai et al. ..................... 438/151 |
| 2008/0081532 | A1 | 4/2008 | Okuno |
| 2008/0121522 | A1 | 5/2008 | Ehira et al. |
| 2008/0132059 | A1 * | 6/2008 | Noguchi et al. ............. 438/643 |
| 2008/0223718 | A1 | 9/2008 | Takagi et al. |
| 2008/0268586 | A1 * | 10/2008 | Fang et al. .................... 438/158 |
| 2008/0284935 | A1 * | 11/2008 | Takahashi et al. ............. 349/46 |
| 2008/0315203 | A1 | 12/2008 | Hino et al. |
| 2009/0001373 | A1 | 1/2009 | Ochi et al. |
| 2009/0004490 | A1 | 1/2009 | Gotou et al. |
| 2009/0011261 | A1 | 1/2009 | Gotou |
| 2009/0026072 | A1 | 1/2009 | Takagi et al. |
| 2009/0133784 | A1 | 5/2009 | Kugimiya et al. |
| 2009/0176113 | A1 | 7/2009 | Gotoh et al. |
| 2009/0242394 | A1 | 10/2009 | Takagi et al. |
| 2009/0243116 | A1 * | 10/2009 | Feustel et al. ................ 257/773 |
| 2010/0012935 | A1 | 1/2010 | Hino et al. |
| 2010/0032186 | A1 | 2/2010 | Gotou et al. |
| 2010/0065847 | A1 | 3/2010 | Gotou et al. |
| 2010/0136738 | A1 * | 6/2010 | Yamamura ..................... 438/98 |
| 2010/0163877 | A1 | 7/2010 | Hino et al. |
| 2010/0207121 | A1 * | 8/2010 | Hino et al. ..................... 257/59 |
| 2010/0231116 | A1 | 9/2010 | Ochi et al. |
| 2011/0024759 | A1 * | 2/2011 | Lee et al. ....................... 257/59 |
| 2011/0169060 | A1 * | 7/2011 | Lee et al. ..................... 257/288 |
| 2012/0235295 | A1 * | 9/2012 | Ahn et al. ..................... 257/734 |
| 2012/0264260 | A1 * | 10/2012 | Hu et al. ....................... 438/158 |
| 2012/0267628 | A1 * | 10/2012 | Koike et al. .................... 257/57 |
| 2012/0289032 | A1 * | 11/2012 | Furusawa et al. ............. 438/478 |

FOREIGN PATENT DOCUMENTS

| | | | |
|---|---|---|---|
| JP | 63 136567 | | 6/1988 |
| JP | 63 136568 | | 6/1988 |
| JP | 64 82673 | | 3/1989 |
| JP | 7 66423 | | 3/1995 |
| JP | 7 326756 | | 12/1995 |
| JP | 11 284195 | | 10/1999 |
| JP | 11 337976 | | 12/1999 |
| JP | 2000174019 A | * | 6/2000 |
| JP | 2001 196371 | | 7/2001 |
| JP | 2002 353222 | | 12/2002 |
| JP | 2003 60210 | | 2/2003 |
| JP | 2003-060210 A | * | 2/2003 |
| JP | 2003060210 A | * | 2/2003 |
| JP | 2003 273109 | | 9/2003 |
| JP | 2004 133422 | | 4/2004 |
| JP | 2004 212940 | | 7/2004 |
| JP | 2005 109512 | | 4/2005 |
| JP | 2005 166757 | | 6/2005 |
| JP | 2007 173816 | | 7/2007 |
| JP | 2008 3319 | | 1/2008 |
| JP | 2008 10801 | | 1/2008 |
| JP | 2008 118124 | | 5/2008 |
| JP | 2008-118124 A | * | 5/2008 |
| WO | WO 2008/047726 A1 | | 4/2008 |

OTHER PUBLICATIONS

U.S. Appl. No. 13/320,673, filed Nov. 15, 2011, Tanifuji, et al.
U.S. Appl. No. 13/056,444, filed Jan. 28, 2011, Onishi, et al.
U.S. Appl. No. 13/387,522, filed Jan. 27, 2012, Goto, et al.
U.S. Appl. No. 13/387,557, filed Jan. 27, 2012, Maeda, et al.
Korean Notice of Preliminary Rejection isseud Mar. 29, 2012, in Korean Patent Application No. 10-2010-7029713 (with English translation).
U.S. Appl. No. 13/122,937, filed Apr. 6, 2011, Nanbu, et al.
U.S. Appl. No. 13/126,126, filed Apr. 26, 2011, Ochi, et al.
Office Action issued Jun. 28, 2012, in Chinese Patent Application No. 200980125535.9 with English translation.
U.S. Appl. No. 13/144,716, filed Jul. 15, 2011, Goto, et al.
U.S. Appl. No. 13/254,316, filed Sep. 1, 2011, Kobayashi, et al.
U.S. Appl. No. 12/936,572, filed Oct. 6, 2010, Kawakami, et al.
U.S. Appl. No. 12/922,764, filed Sep. 15, 2010, Goto, et al.
U.S. Appl. No. 12/922,965, filed Sep. 16, 2010, Nakai, et al.
U.S. Appl. No. 12/918,727, filed Aug. 20, 2010, Miki, et al.
International Search Report issued Aug. 11, 2009 in PCT/JP09/062213 filed Jul. 3, 2009.
U.S. Appl. No. 13/581,436, filed Aug. 27, 2012, Iwasaki, et al.
Office Action issued Oct. 30, 2012, in Taiwanese Application No. 098122648, (with English-language Translation).

* cited by examiner

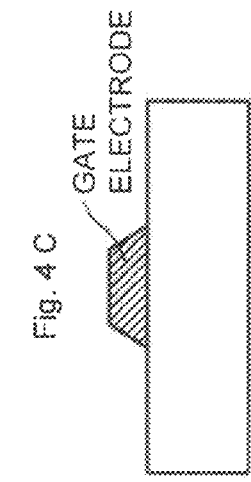
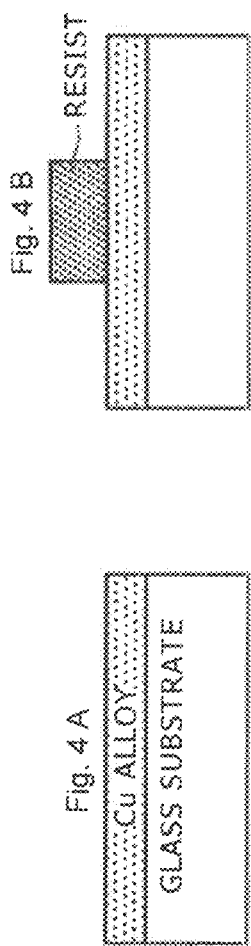
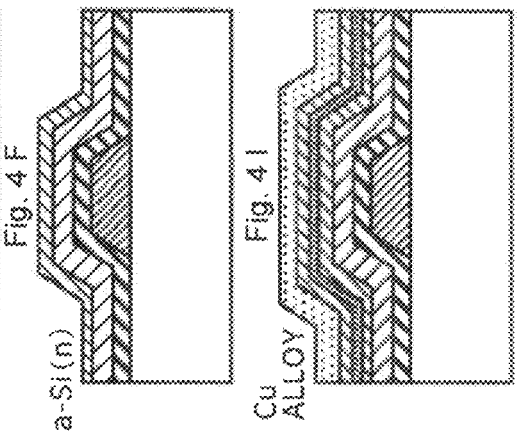
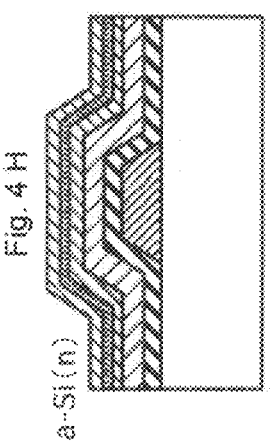
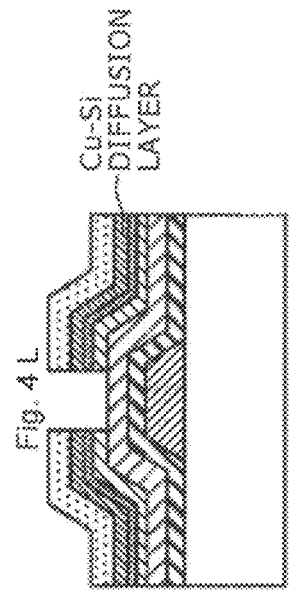
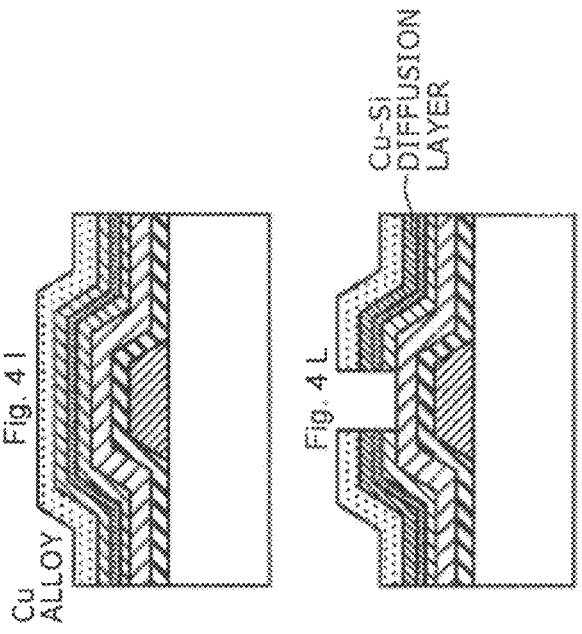
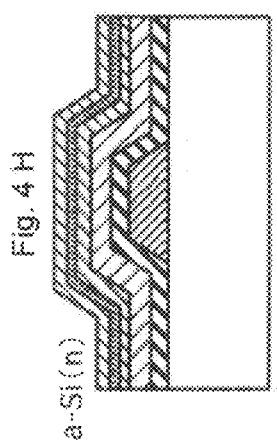
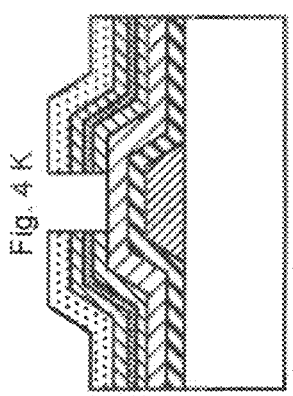
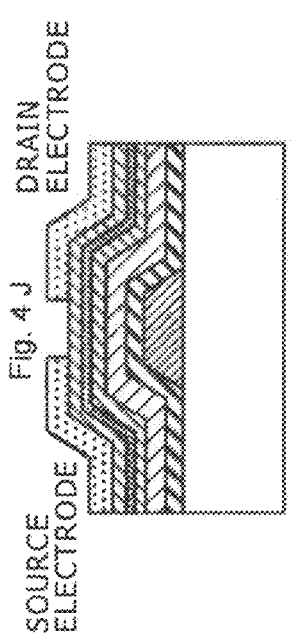

F I G . 5
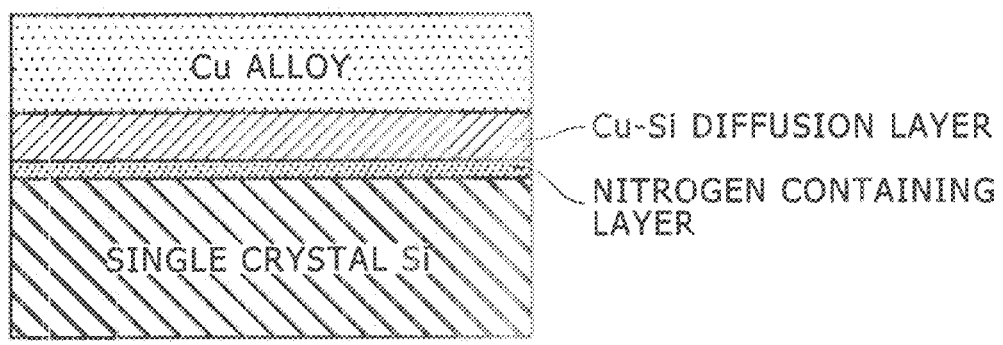

FIG.7
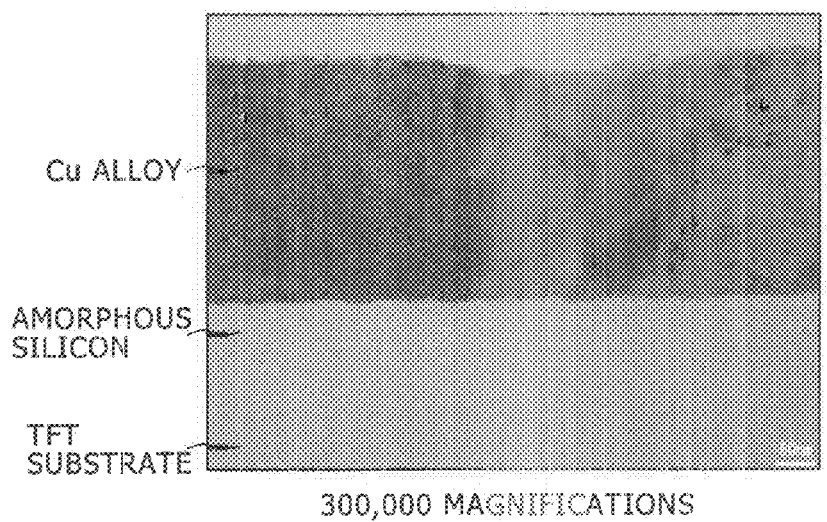
300,000 MAGNIFICATIONS
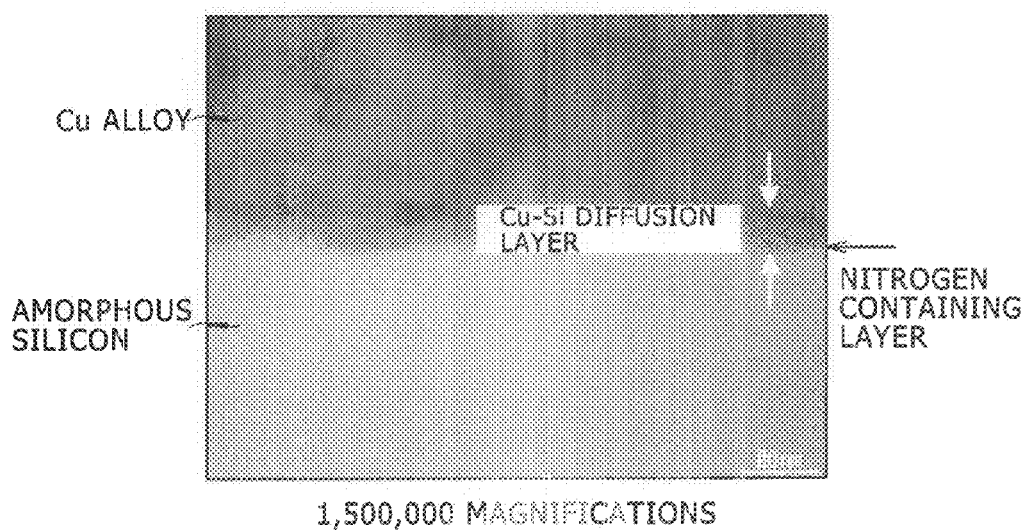
1,500,000 MAGNIFICATIONS

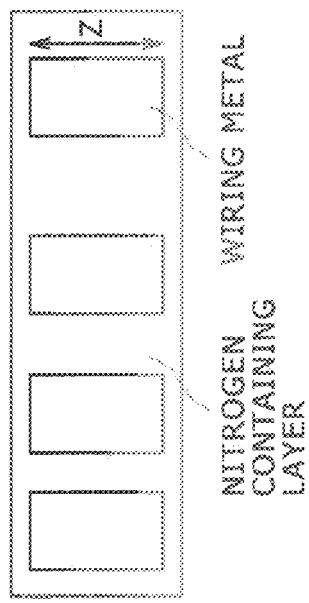
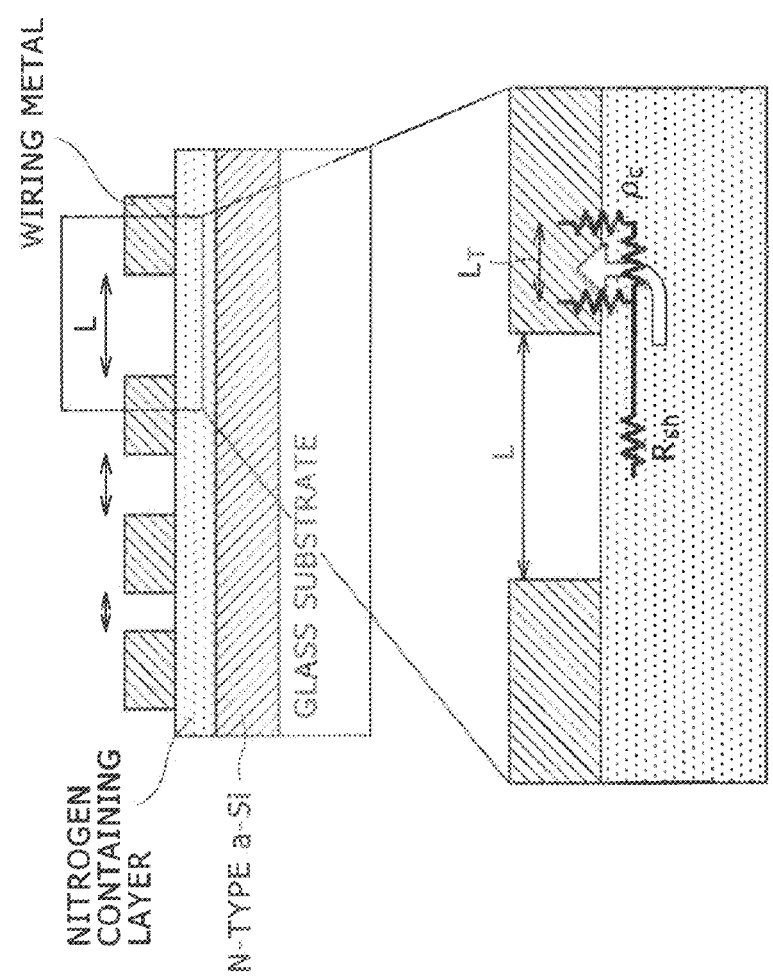
FIG. 10A SECTIONAL VIEW
FIG. 10B TOP VIEW

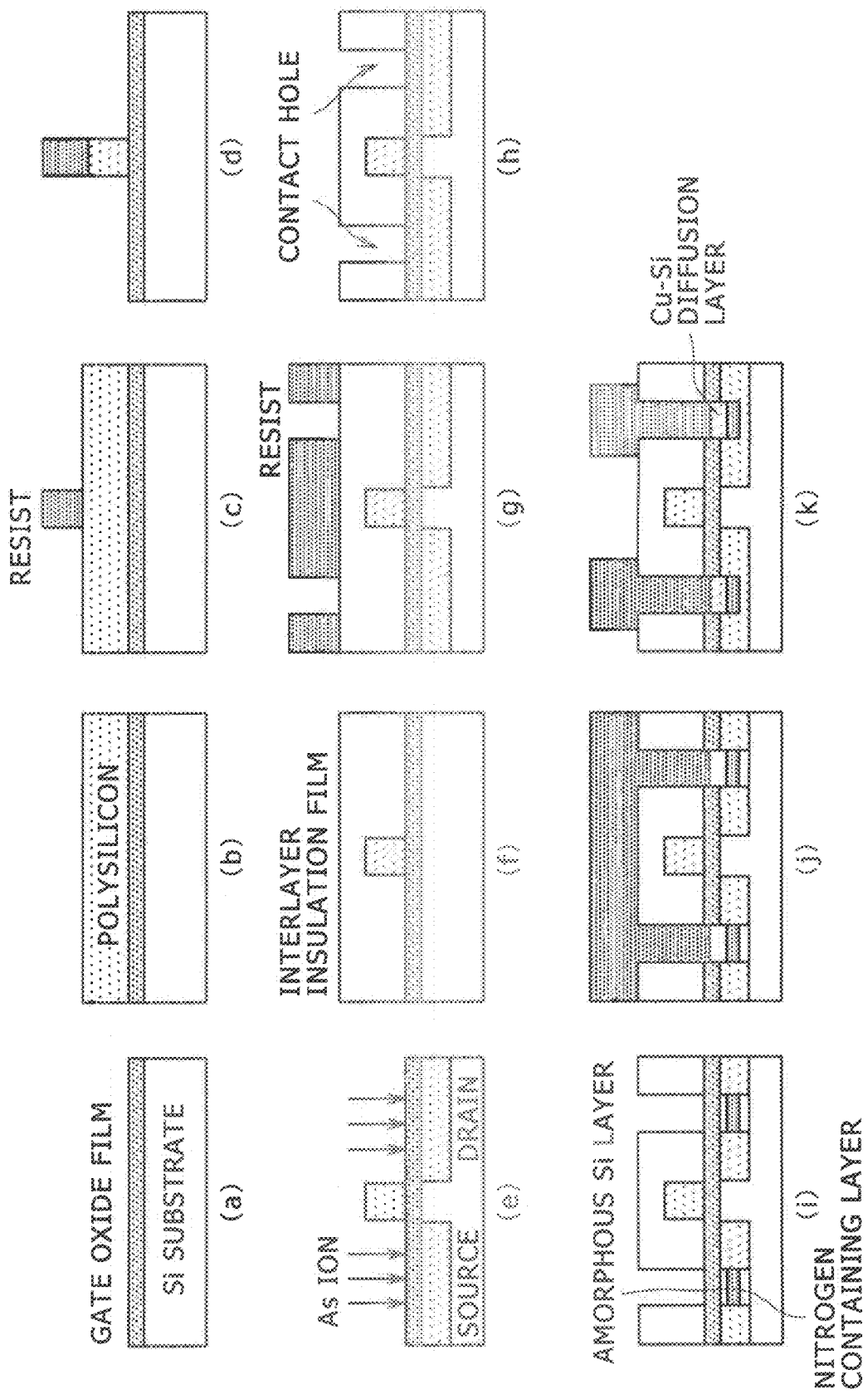

WIRING STRUCTURE, THIN FILM TRANSISTOR SUBSTRATE, METHOD FOR MANUFACTURING THIN FILM TRANSISTOR SUBSTRATE, AND DISPLAY DEVICE

TECHNICAL FIELD

The present invention relates: to a wiring structure, a thin film transistor substrate, a method for manufacturing the thin film transistor substrate, and a display device, which are applicable to a flat-panel display (display device) such as a liquid crystal display or an organic EL display or a semiconductor device such as a ULSI (Ultra Large-Scale Integrated Circuit), an ASIC (Application Specific Integrated circuit), an FET (Field Effect Transistor), or a diode; and in particular to a novel wiring structure including a Cu alloy film composed of pure Cu or a Cu alloy as a wiring material.

BACKGROUND ART

An active matrix liquid crystal display device such as a liquid crystal display uses a thin film transistor (hereunder referred to as TFT) as a switching device and comprises: a transparent pixel electrode; a wiring part including a gate wiring and a source/drain wiring; a TFT substrate having a semiconductor layer composed of amorphous silicon (a-Si) or polysilicon (p-Si); a counter substrate being disposed oppositely apart from the TFT substrate at a prescribed interval and having a common electrode; and a liquid crystal layer embedded between the TFT substrate and the counter substrate.

In a TFT substrate, pure Al or an Al alloy such as Al—Nd is generally used as a wiring material for a gate wiring or a source/drain wiring because it has a low electric resistivity and can be patterned easily. Meanwhile, a problem such as RC delay of wiring (a phenomenon of delay of electric signals transferring in wiring) becomes obvious in accordance with the upsizing of a liquid crystal display and needs for a wiring material having a lower resistance are increasing. Consequently, pure Cu or a Cu alloy such as Cu—Ni (hereunder collectively referred to as a Cu alloy) having a lower electric resistivity than an Al alloy has been attracting attention.

As described in Patent Literatures 1 to 6, a barrier metal layer comprising a high melting point metal such as Mo, Cr, Ti, or W is generally formed between a Cu alloy wiring film (Cu alloy film) and a semiconductor layer of a TFT. The reason is that, when a Cu alloy wiring film is brought into direct contact with a semiconductor layer of a TFT without interposing a barrier metal layer, Cu in the Cu alloy wiring film diffuses into the semiconductor layer due to thermal history in a succeeding process (for example, a process for forming an insulating layer on the TFT or a thermal process such as a sintering or annealing process) and the TFT properties deteriorate. More specifically, electric current (off-state current at the time of switch-off or on-state current at the time of switch-on) flowing in the TFT or the like is adversely affected, the increase of the off-state current or the decrease of the on-state current is caused, and also a switching speed (responsiveness to an electric signal of switch-on) lowers. Further, it sometimes happens that the contact resistance between the Cu alloy wiring film and the semiconductor layer increases.

A barrier metal layer is effective in inhibiting interdiffusion between Cu and Si at the interface between a Cu alloy film and a semiconductor layer as stated above but, in order to form a barrier metal layer, a film forming device for barrier metal forming is required separately in addition to a film forming device for Cu alloy wiring film forming. More specifically, a film forming device equipped additionally with a film forming chamber for barrier metal layer forming (typically, a cluster tool in which plural film forming chambers are connected to a transfer chamber) has to be used and that causes a production cost to increase and productivity to lower. Further, since an etching rate at a working process such as wet etching using a chemical liquid or the like is different between a metal used as a barrier metal layer and a Cu alloy, it comes to be very difficult to control working dimensions in the lateral direction at a working process. As a result, the forming of a barrier metal layer causes: processes to be complicated; a production cost to increase; and productivity to lower, from the viewpoints of not only film forming but also working.

In the above case, explanations have been made by exemplifying a liquid crystal display device as a representative example of a display device. The aforementioned problem caused by interdiffusion between Cu and Si at the interface between a Cu alloy film and a semiconductor layer is seen not only in a display device however but also in a semiconductor device such as an LSI or an FET. In the production of an LSI that is a representative example of a semiconductor device for example, a Cu alloy film is formed after a barrier metal layer composed of Cr, Mo, or TaN is formed over a semiconductor layer or an insulator layer in order to prevent Cu atoms from dispersing from the Cu alloy film into the semiconductor layer or the insulator layer and the simplification processes and the reduction of costs are desired also in the field of a semiconductor device.

For that reason, provision of a technology that can avoid the problem caused by interdiffusion between Cu and Si occurring in a display device or a semiconductor device even when a barrier metal layer is not formed unlike a conventional case is desired.

In view of the above situation, a direct contact technology that can omit the formation of a barrier metal layer and can bring an Al alloy wiring used for a source/drain electrode or the like into direct contact with a semiconductor layer, which is a technology of using not a Cu alloy but pure Al or an Al alloy as a wiring material, is proposed in Patent Literatures 7 to 9. In the Patent Literatures, Patent Literature 9 is disclosed by the present applicants and discloses a wiring structure in which a material comprising a nitrogen containing layer and an Al alloy film is used and N (nitrogen) in the nitrogen containing layer bonds with Si in a semiconductor layer. It is estimated that the nitrogen containing layer functions as a barrier layer for preventing interdiffusion between Al and Si and it is verified that excellent TFT properties can be obtained even when a barrier metal layer composed of Mo or the like is not formed unlike a conventional case. Further, another advantage is that, since the nitrogen containing layer can be formed easily by applying nitriding treatment such as plasma nitridation after a semiconductor layer is formed and before an Al alloy film is formed, a specific film forming device for barrier metal forming is not required.

PRIOR ART LITERATURE

Patent Literature

[Patent Literature 1] JP-A No. 66423/H7 (1995)
[Patent Literature 2] JP-A No. 196371/2001
[Patent Literature 3] JP-A No. 353222/2002
[Patent Literature 4] JP-A No. 133422/2004
[Patent Literature 5] JP-A No. 212940/2004
[Patent Literature 6] JP-A No. 166757/2005

[Patent Literature 7] JP-A No. 273109/2003
[Patent Literature 8] JP-A No. 3319/2008
[Patent Literature 9] JP-A No. 10801/2008

DISCLOSURE OF THE INVENTION

An object of the present invention is to provide a direct contact technology that makes it possible to omit a barrier metal layer between a Cu alloy wiring film composed of pure Cu or a Cu alloy and a semiconductor layer, which is a technology that makes it possible to connect a Cu alloy wiring film to a semiconductor layer directly and firmly in a wide process margin.

The gist of the present invention is shown below.

[1] A wiring structure provided with a semiconductor layer and a Cu alloy film composed of pure Cu or a Cu alloy over a substrate in this order from the substrate side, in which: the wiring structure includes a laminated structure comprising an (N, C, F) layer containing at least one element selected from the group consisting of nitrogen, carbon, and fluorine and a Cu—Si diffusion layer containing Cu and Si between the semiconductor layer and the Cu alloy film in this order from the substrate side; and at least one element selected from among nitrogen, carbon, and fluorine contained in the (N, C, F) layer bonds with Si contained in the semiconductor layer.

Here, the above wiring structure is preferably a wiring structure provided with a semiconductor layer and a Cu alloy film composed of pure Cu or a Cu alloy over a substrate in this order from the substrate side, in which: the wiring structure includes a laminated structure comprising an (N, C, F) layer containing at least one element selected from the group consisting of nitrogen, carbon, and fluorine and a Cu—Si diffusion layer containing Cu and Si between the semiconductor layer and the Cu alloy film in this order from the substrate side; and any one of the elements of nitrogen, carbon, and fluorine constituting the (N, C, F) layer bonds with Si in the semiconductor layer.

[2] A wiring structure according to Item [1], in which the Cu—Si diffusion layer is obtained by forming the (N, C, F) layer, the semiconductor layer, and the Cu alloy film in this order and thereafter applying thermal history.

[3] A wiring structure according to Item [1] or [2], in which the semiconductor layer contains amorphous silicon or polysilicon.

Here, it is preferable that the semiconductor layer comprises amorphous silicon or polysilicon.

[4] A thin film transistor substrate provided with a wiring structure according to any one of Items [1] to [3].

[5] A display device provided with a thin film transistor substrate according to Item [4].

[6] A wiring structure according to any one of Items [1] to [3] constituting a display device or a semiconductor device.

[7] A method for manufacturing a thin film transistor substrate according to Item [4], comprising: a first process of forming an (N, C, F) layer containing at least one element selected from the group consisting of nitrogen, carbon, and fluorine over a semiconductor layer of a thin film transistor; and a second process of successively forming a semiconductor layer in this order.

[8] A manufacturing method according to Item [7], in which the first process is carried out in semiconductor layer forming equipment.

[9] A manufacturing method according to Item [8], in which the first process and the second process are carried out continuously in an identical semiconductor layer forming chamber.

[10] A manufacturing method according to any one of Items [7] to [9], in which the first process includes a process of forming an (N, C, F) layer by plasma etching with a gas containing at least one element selected from the group consisting of nitrogen, carbon, and fluorine.

[11] A manufacturing method according to any one of Items [7] to [9], in which the first process includes a process of forming an (N, C, F) layer by plasma etching with a mixed gas comprising a gas containing at least one element selected from the group consisting of nitrogen, carbon, and fluorine and a source gas used for forming a semiconductor layer.

The present invention makes it possible to provide a direct contact technology capable of bringing a Cu alloy film composed of pure Cu or a Cu alloy into direct contact with a semiconductor layer, the technology being excellent in TFT properties and contact resistance between the Cu alloy film and the semiconductor layer, showing a good productivity, and further expanding a process margin. More specifically, the present invention makes it possible to provide a technology that: is hardly affected by the variations of various process conditions (variations of equipment performance, instability, unexpected contamination, hardly controllable contamination, and others); does not require extremely severe condition control; and is hardly subjected to the restriction of process conditions.

BRIEF DESCRIPTION OF THE DRAWINGS

FIG. 4 is a process chart explaining individual processes for forming a wiring structure according to the present invention.

FIG. 5 is an explanatory schematic sectional view showing a configuration of an LSI according to the third embodiment of the present invention.

FIG. 7 comprises TEM photographs each of which shows a section of an interface between amorphous silicon and a Cu alloy film in Example 1.

FIGS. 10A and 10B are views explaining the measurement principle of a contact resistance in a TLM element.

FIG. 11 is a process chart explaining processes for manufacturing a MOSFET.

BEST MODE FOR CARRYING OUT THE INVENTION

Figure 1A:
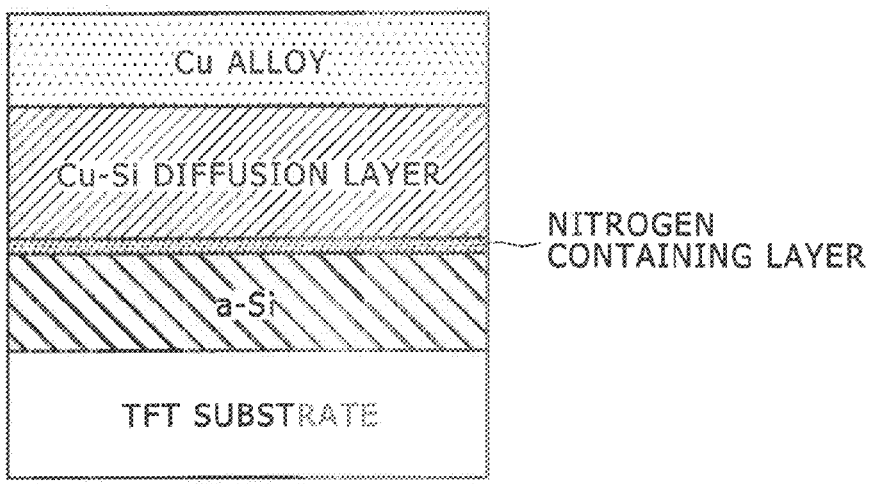
FIG. 1A is an explanatory schematic sectional view showing a configuration of a TFT according to the first embodiment of the present invention.

The present invention relates to a direct contact technology capable of bringing a Cu alloy film into direct contact with a semiconductor layer. More specifically, the present invention is characterized by a wiring structure including a laminated structure formed by stacking a Cu—Si diffusion layer containing Cu and Si, which plays a role as a cover layer protecting a nitrogen containing layer from the atmosphere, over the nitrogen containing layer on the basis of a direct contact technology (it will be described later) that: makes use of interdiffusion preventive action between Cu and Si caused by the nitrogen containing layer; and is disclosed in advance by the present applicants. The Cu—Si diffusion layer: is formed by forming an (N, C, F) containing layer, a semiconductor layer, and a Cu alloy film in sequence and thereafter applying thermal history of about 150° C. or higher in a process for manufacturing a TFT; and comprises Cu in the Cu alloy film and Si in the semiconductor layer.

How the present invention is established is explained hereunder.

As stated earlier, the present applicants have already disclosed a wiring structure in which a material comprising a nitrogen containing layer and a Cu alloy film is used and N (nitrogen) of the nitrogen containing layer bonds with Si in a semiconductor layer as a direct contact technology of the Cu alloy film and the semiconductor layer (Japanese Patent Application No. 265810/2007, hereunder referred to as the related art). The technology of the related art is substantially identical to a direct contact technology that uses an Al alloy described in Patent Literature 9 except that the wiring material is a Cu alloy. In the related art, it is estimated that the nitrogen containing layer functions as a barrier layer for preventing interdiffusion between Cu and Si and it is verified that excellent TFT properties can be obtained even when a barrier metal layer composed of Mo or the like is not formed unlike a conventional case. Further, another advantage is that, since the nitrogen containing layer can be formed easily by nitriding treatment such as plasma nitridation after a semiconductor layer is formed and before a Cu alloy film is formed, a specific film forming device for forming barrier metal is not required.

The present inventors have further studied mainly from the viewpoint of improving productivity even after the above related art is disclosed. In order to obtain a wiring structure described in the related art (a configuration in which a semiconductor layer is brought into direct contact with a Cu alloy film while interposing a nitrogen containing layer), firstly a semiconductor layer and a nitrogen containing layer are formed in a semiconductor layer forming chamber such as plasma CVD equipment (under vacuum) and successively the material is transferred to and processed in a specific chamber (under vacuum) in order to form a Cu alloy film by a sputtering method or the like. As a result of the studies by the present inventors, it has been found that, if the surface of a nitrogen containing layer is excessively contaminated by being exposed in the atmosphere or the like on the occasion of the transfer, problems such as the deterioration and the variations of electrical properties (TFT properties and a contact resistance between a semiconductor layer and a Cu alloy film) are caused. Then as a result of studying intensively in order to avoid the problems, the following configurations (I) to (IV) are attained and the present invention is completed.

Figure 3:
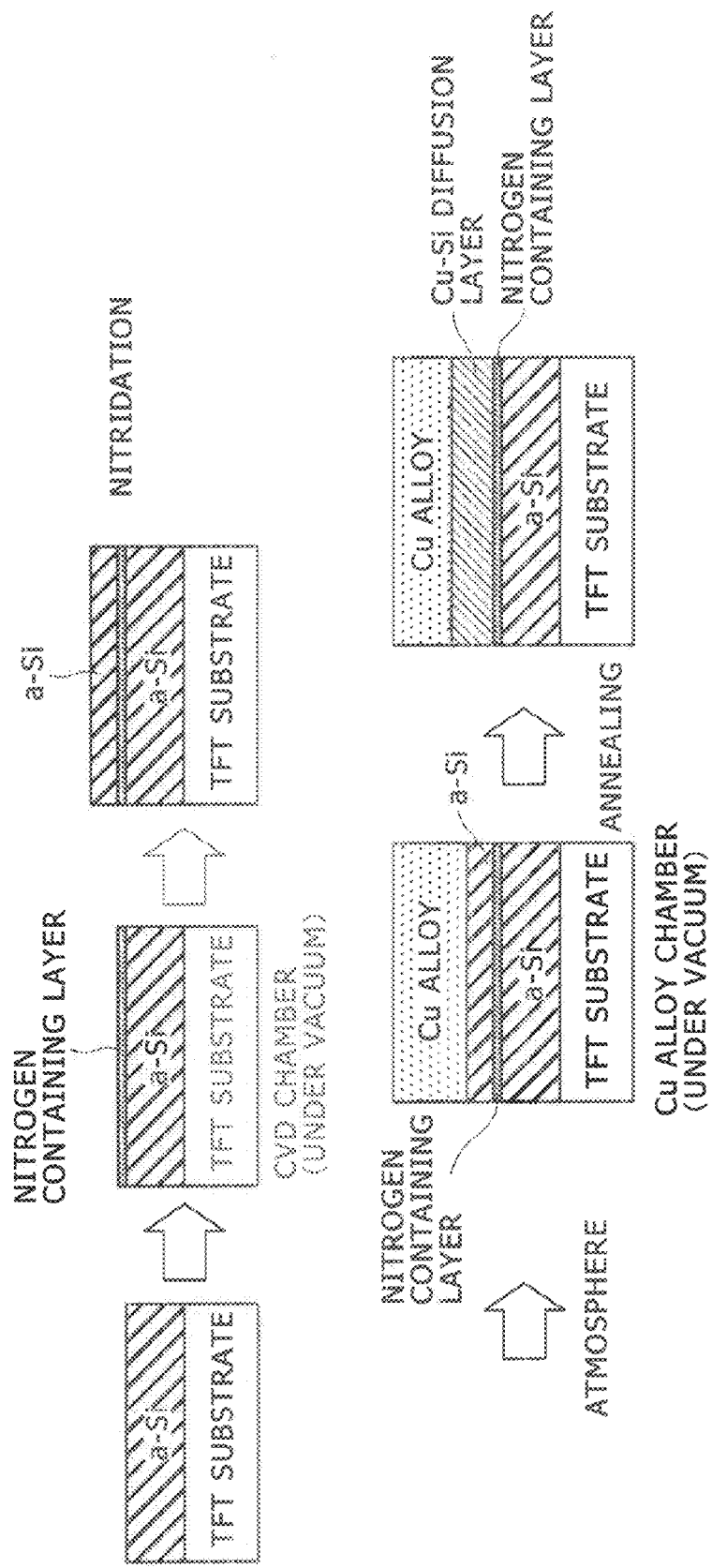
FIG. 3 is a schematic process chart explaining processes for forming a wiring structure according to the present invention.

(I) A manufacturing method according to the present invention is characterized by: not forming a Cu alloy film directly over a nitrogen containing layer like the related art; but forming an (N, C, F) layer represented by a nitrogen containing layer or the like and thereafter further forming a semiconductor layer over the (N, C, F) layer consecutively in an identical chamber as shown in the schematic process chart of FIG. 3. It has been found that, after the method is applied, by successively transferring the material to a chamber exclusive for a Cu ally film in the same way as the related art, forming a Cu alloy film, and thereafter manufacturing a TFT by a known method, the semiconductor layer turns into a Cu—Si diffusion layer through the succeeding thermal history (this will be described at the next paragraph (II) in detail), problems of the deterioration of TFT properties and the increase of a contact resistance caused by the contamination of an (N, C, F) layer and the variations of those are eliminated, and resultantly a direct contact technology of bringing a semiconductor layer into direct and firm contact with a Cu alloy film in a TFT and showing good electrical properties can be provided (refer to Examples described later).

The main reason why a semiconductor layer is used in the present invention is that the simplification of film forming processes is taken into consideration. By so doing, it is possible to carry out all of the series of processes for forming a semiconductor layer (not a semiconductor layer that turns into a Cu—Si diffusion layer but a semiconductor layer formed over a TFT substrate), an (N, C, F) layer, and a semiconductor layer over the TFT substrate continuously in an identical chamber and hence the material is not exposed in the atmosphere.

(II) A wiring structure according to the present invention obtained by the above method has a laminated structure formed by stacking a Cu—Si diffusion layer containing Cu and Si over an (N, C, F) layer as shown in FIG. 1A for example unlike the structure described in the related art. The Cu—Si diffusion layer: is formed by forming an (N, C, F) layer, a semiconductor layer, and a Cu alloy film in sequence and thereafter applying thermal history in the manufacturing processes of a TFT; and is obtained by diffusing Cu in the Cu alloy film into Si in the semiconductor layer by heat treatment of about 150° C. or higher (preferably 180° C. or higher). The Cu—Si diffusion layer obtained in this way comprises Cu in the Cu alloy film and Si in the semiconductor layer and plays a role as a cover layer protecting the (N, C, F) layer from the atmosphere. The Cu—Si diffusion layer may be formed directly over the (N, C, F) layer as shown in Example 1 that will be described later and FIG. 1A but is not limited to this case.

Outline of a Cu—Si diffusion layer obtained by a method according to the present invention is shown in FIG. 7 for reference. FIG. 7 comprises TEM photographs (magnifications of 300,000 and 1,500,000) each of which shows a section in Example 1 (present example) that will be described later and a thin Cu—Si diffusion layer (about 10 nm here) is formed continuously between a semiconductor layer (a-Si) and a Cu alloy film. In the present example, the diffusion of Cu atoms into a semiconductor layer can be inhibited effectively and hence no Cu atoms are detected in the semiconductor layer. Consequently, it has been confirmed that interdiffusion of Cu and Si at an interface can be prevented by a method according to the present invention in the same way as the related art.

(III) In the present invention, an (N, C, F) layer is disclosed as a barrier layer having interdiffusion preventive action between Cu and Si. Although only a nitrogen containing layer is disclosed as a barrier layer that prevents interdiffusion between Cu and Si in the related art, as a result of the subsequent studies by the present inventors, it has been confirmed through experiments: that the above action is not limited to a nitrogen containing layer and a layer containing carbon or fluorine also exhibits similar action; and more specifically that an (N, C, F) layer containing at least one element selected from the group consisting of nitrogen, carbon, and fluorine can exhibit a result substantially similar to a nitrogen containing layer without exception. As stated above, the present invention is a technology obtained by further developing the technology in the related art on the point that an (N, C, F) layer is used as a barrier layer.

(IV) It has been found that a technology according to the present invention is very useful as a technology for preventing interdiffusion between Cu and Si at an interface between a Cu alloy film and a semiconductor layer and can be applied not only to a display device such as a liquid crystal display device but also to a semiconductor layer device such as an LSI or an FET.

The present invention is explained hereunder in detail. As stated above, the present invention is an improvement technology of the related art, a nitrogen containing layer characterizing the related art is precisely described in aforementioned Patent literature 9 and a part of the laminated structure and a part of the manufacturing method duplicate Patent Literature 9. In the present description, explanations are focused on the differences from Patent Literature 9 and the duplicated parts are not explained in detail (for example, a method for forming a nitrogen containing layer) but summarized in some cases. With regard to details of the duplicated parts, Patent Literature 9 may be referred to.

Figure 1B:
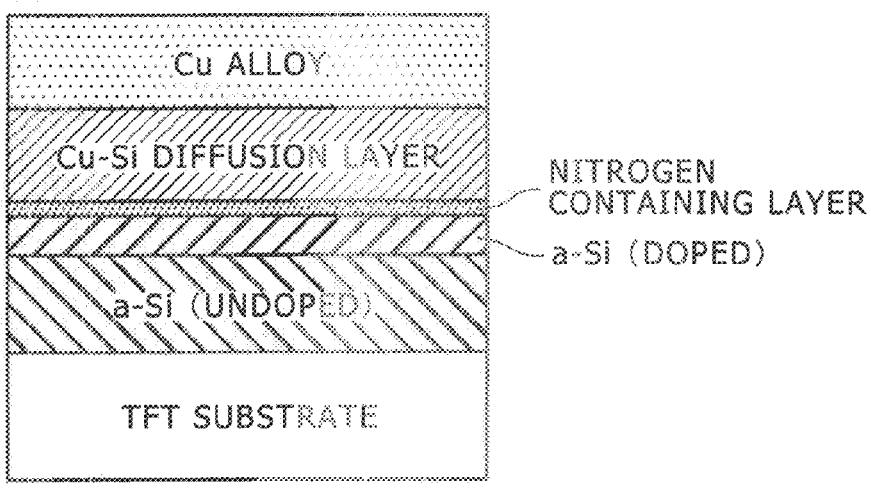
FIG. 1B is an explanatory schematic sectional view showing a configuration of a TFT according to the first embodiment of the present invention.
Figure 1C:
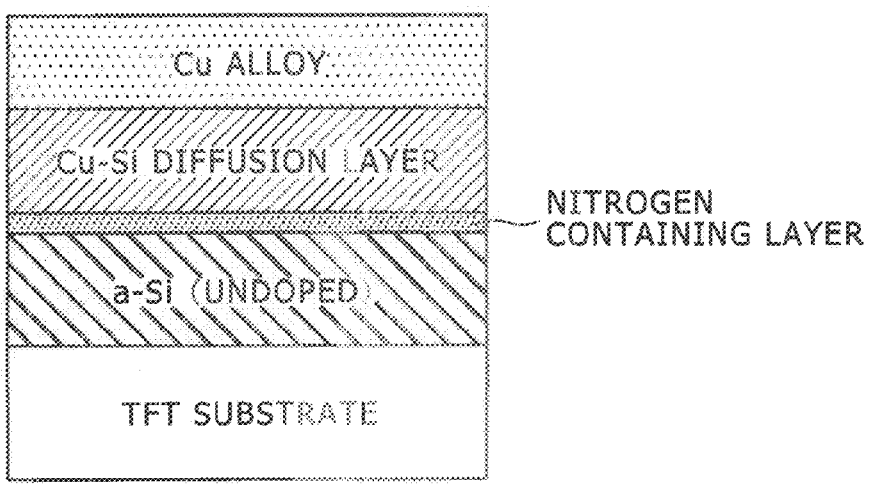
FIG. 1C is an explanatory schematic sectional view showing a configuration of a TFT according to the first embodiment of the present invention.
Figure 2:
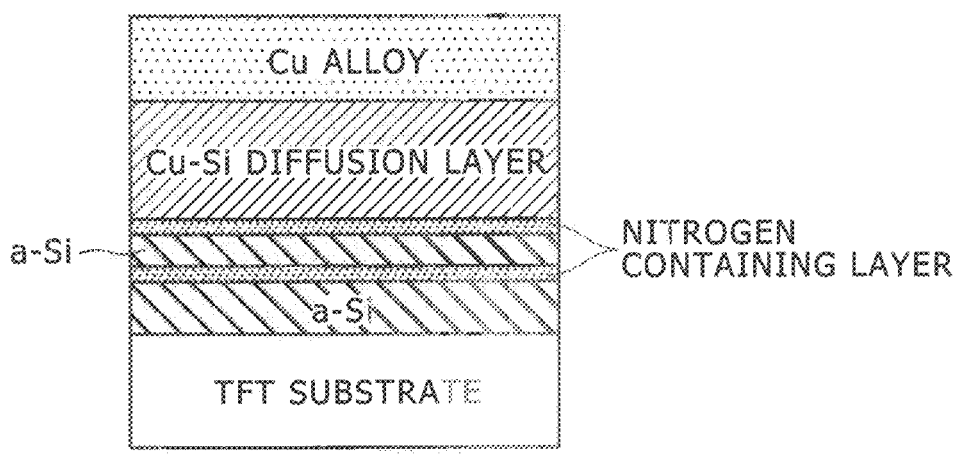
FIG. 2 is an explanatory schematic sectional view showing a configuration of a TFT according to the second embodiment of the present invention.

Firstly in reference to FIGS. 1A to 1C and 2, a wiring structure and a method for manufacturing the wiring structure according to the present invention are explained. A wiring structure according to the present invention: is a wiring structure provided with a semiconductor layer and a Cu alloy film composed of pure Cu or a Cu alloy over a substrate in this order from the substrate side; and includes a laminated structure comprising an (N, C, F) layer containing at least one element selected from the group consisting of nitrogen, carbon, and fluorine and a Cu—Si diffusion layer containing Cu and Si in this order from the substrate side between the semiconductor layer and the Cu alloy film. Such a laminated structure may be at least formed between a semiconductor layer and a Cu alloy film and it is also possible to form such a laminated structure directly over a semiconductor layer as shown in FIGS. 1A to 1C for example. That is, a wiring structure according to the present invention may have a plurality of (N, C, F) layers. A wiring structure according to the present invention is not limited to this case however and for example an embodiment having a semiconductor layer, an (N, C, F) layer, and a semiconductor layer in this order from the substrate side and having an aforementioned laminated structure thereover as shown in FIG. 2 is also included in the scope of the present invention. The present invention is not limited to the embodiments.

As stated repeatedly, a feature specific to the present invention in comparison with the related art is that a Cu—Si diffusion layer is formed over an (N, C, F) layer. The Cu—Si diffusion layer may be formed directly over (immediately above) an (N, C, F) layer for example (refer to Example 1 and FIG. 1A). Such a Cu—Si diffusion layer can be obtained by forming an (N, C, F) layer, a semiconductor layer, and a Cu alloy film in this order and thereafter applying thermal history of about 150° C. or higher.

First to third embodiments of a wiring structure according to the present invention are hereunder explained in detail in reference to drawings. The explanations below are made on the basis of the first and second embodiments of a TFT representing a display device and the third embodiment of a MOSFET representing a semiconductor layer, to which a laminated structure of the present invention is applied, but it does not mean that the present invention is limited to those embodiments. Meanwhile, a semiconductor layer may comprise either amorphous silicon or polysilicon.

Meanwhile, in the following explanations for the sake of convenience, in order to differentiate a semiconductor layer that is formed over an (N, C, F) layer and can turn into a Cu—Si diffusion layer finally protecting the (N, C, F) layer from the atmosphere by the subsequent thermal history from a semiconductor layer that is formed directly over a TFT substrate, the former semiconductor layer that can act as a protective layer is called "a second semiconductor layer" and the latter semiconductor layer is called "a first semiconductor layer" in some cases.

First Embodiment According to the Present Invention

The first embodiment of a TFT according to the present invention is shown in FIG. 1A. The first embodiment shown in FIG. 1A represents a structure having: a first semiconductor layer over a TFT substrate; a double-layered laminated structure comprising an (N, C, F) layer and a Cu—Si diffusion layer directly thereover; and a Cu alloy layer directly thereover. The structure shown in FIG. 1A can be obtained by forming an (N, C, F) layer, thereafter forming a second semiconductor layer and successively a Cu alloy layer, and thereafter applying thermal history of about 150° C. or higher and can be obtained by the method of Example 1 that will be described later for example.

In the first embodiment, an (N, C, F) layer constituting a wiring structure contains any of the elements of nitrogen, carbon, and fluorine. The (N, C, F) layer: is formed so that the whole surface of a semiconductor layer may be almost covered; and hence effectively acts as a barrier for preventing interdiffusion between Cu and Si at an interface between a Cu alloy and the semiconductor layer. A preferable (N, C, F) layer is a nitrogen containing layer. More specifically, nitrogen, carbon, or fluorine constituting the aforementioned layer bonds with Si in a semiconductor layer and Si nitride, Si carbide, or Si fluoride is contained mostly. Besides those, a compound of Si oxynitride containing oxygen may be included. Si oxynitride or the like is obtained by bonding with oxygen (O) introduced inevitably at a process for forming a nitrogen containing layer or the like for example.

Here, it is preferable that the total of area densities of nitrogen atoms, carbon atoms, and fluorine atoms contained in an (N, C, F) layer is either identical to or higher than the area density of effective bonds of a semiconductor layer material (typically Si). As described precisely in Patent Literature 9 and the related art, it is necessary to cover the surface of a semiconductor layer with an (N, C, F) layer such as a nitrogen containing layer in order to prevent interdiffusion between a metal wiring material and a semiconductor material. On this occasion, it is preferable that dangling bonds existing on a semiconductor layer surface bond with elements constituting the aforementioned layer. The term "effective bonds" means bonds that can be placed on a semiconductor layer surface after taking the steric hindrance of nitrogen atoms, carbon atoms, and fluorine atoms into consideration and the term "area density of effective bonds" means an area density when the whole surface of a semiconductor layer is covered with an (N, C, F) layer. An area density of effective bonds varies in accordance with the kind of a semiconductor material and the like and, in the case of silicon for example, is roughly in the range of $10^{14}$ cm$^{-2}$ to $2\times10^{16}$ cm$^{-2}$ although it varies to some extent also in accordance with the plane orientation of a crystal.

More specifically, in either of the case where a nitrogen containing layer mainly contains Si nitride or the case where a nitrogen containing layer mainly contains Si nitride and further contains Si oxynitride for example, nitrogen in the nitrogen containing layer preferably has an area density (N1) of $10^{14}$ cm$^{-2}$ or more and $2\times10^{16}$ cm$^{-2}$ or less at an interface touching a semiconductor layer. In order to secure desired TFT properties and the like, the lower limit of an area density of nitrogen in a nitrogen containing layer is yet preferably $2\times10^{14}$ cm$^{-2}$ and still yet preferably $4\times10^{14}$ cm$^{-2}$. Likewise, carbon in a carbon containing layer preferably has an area density (C1) of $10^{14}$ cm$^{-2}$ or more and $2\times10^{16}$ cm$^{-2}$ or less at an interface touching a semiconductor layer, and further the area density is yet preferably $2\times10^{14}$ cm$^{-2}$ or more and still yet preferably $4\times10^{14}$ cm$^{-2}$ or more. Then in the same way as above cases, fluorine in a fluorine containing layer preferably has an area density (F1) of $10^{14}$ cm$^{-2}$ or more and $2\times10^{16}$ cm$^{-2}$ or less at an interface touching a semiconductor layer, and further the area density is yet preferably $2\times10^{14}$ cm$^{-2}$ or more and still yet preferably $4\times10^{14}$ cm$^{-2}$ or more.

An (N, C, F) layer may include at least one layer containing Si—N bond, Si—C bond, or Si—F bond. Here, the distance (interatomic distance) between Si and N in Si—N bond is about 0.18 nm and, substantially in a nitrogen containing layer, is preferably 0.2 nm or more and yet preferably 0.3 nm or more. If the area density of nitrogen (N1) in a nitrogen containing layer is too high however, insulative Si nitride contained in the nitrogen containing layer also increases, electric resistance increases, and TFT properties deteriorate. The upper limit of the area density of nitrogen in a nitrogen containing layer is yet preferably $1\times10^{16}$ cm$^{-2}$. From a similar viewpoint, the distance (interatomic distance) between Si and C in Si—C bond is about 0.19 nm and, substantially in a carbon containing layer, is preferably 0.2 nm or more and yet preferably 0.3 nm or more. Then the upper limit of the area density of carbon in a carbon containing layer is yet preferably $1\times10^{16}$ cm$^{-2}$. From a similar viewpoint, the distance (interatomic distance) between Si and F in Si—F bond is about 0.16 nm and, substantially in a fluorine containing layer, is preferably 0.18 nm or more and yet preferably 0.25 nm or more. Then the upper limit of the area density of fluorine in a fluorine containing layer is yet preferably $1\times10^{16}$ cm$^{-2}$.

Here, in the case where an (N, C, F) layer contains an oxygen containing compound like Si oxynitride or the like (for example, the case where, in addition to Si nitride, Si oxide is further contained), it is preferable that the total of the area densities of the elements constituting the aforementioned layer satisfies the above requirements and the total (N1+C1+F1)/O1 of the ratios of the area densities of the elements (N1, C1, and F1) to the area density of oxygen (O1) is 1.0 or more. Thereby TFT properties improve further. Although a nitrogen containing compound such as nitride of Si and an oxygen containing compound such as oxynitride of Si are insulating materials intrinsically, the thickness of an (N, C, F) layer is roughly 0.18 nm or more and 5 nm or less and very thin as it will be described later and hence it is possible to lower electric resistance.

As a result of experiments by the present inventors, it is found that TFT properties are affected by the ratio (N1+C1+F1)/O1 and the ratio (N1+C1+F1)/O1 may be increased to 1.0 or more in order to obtain better TFT properties. It is estimated that, when the ratio (N1+C1+F1)/O1 increases, the resistance component in an (N, C, F) layer decreases and hence good transistor properties can be obtained. The larger the ratio (N1+C1+F1)/O1, the better. For example, the ratio (N1+C1+F1)/O1 is preferably 1.05 or more and yet preferably 1.1 or more.

The ratio (N1+C1+F1)/O1 can be adjusted for example by appropriately controlling plasma generating conditions such as a gas pressure, a gas composition, and a processing temperature of plasma when a nitrogen containing layer is formed by a plasma nitridation method.

An area density of nitrogen (N1), an area density of carbon (C1), an area density of fluorine (F1), and an area density of oxygen (O1) in an (N, C, F) layer can be computed for example by an RBS method (Rutherford Backscattering Spectrometry).

The thickness of an (N, C, F) layer is preferably in the range of about 0.18 nm to 5 nm. Although an (N, C, F) layer is useful as a barrier layer for preventing interdiffusion between Cu and Si at an interface between a Cu alloy layer and a semiconductor layer as stated above, the (N, C, F) layer is likely to be an insulator and hence, if the thickness increases excessively, electric resistance increases to the utmost extent and TFT performances deteriorate. By controlling the thickness of an (N, C, F) layer in the above range, it is possible to suppress the increase of electric resistance caused by the formation of an (N, C, F) layer within a range of the extent not adversely affecting TFT properties. The thickness of an (N, C, F) layer is preferably about 3 nm or less, yet preferably 2 nm or less, and still yet preferably 1 nm or less. The thickness of an (N, C, F) layer can be obtained by various physical analysis methods and for example, in addition to the aforementioned RBS method, an XPS method (X-ray photoelectron spectroscopy), an SIMS method (Secondary Ion Mass Spectrometry), or a GD-OES (Radiofrequency Glow Discharge Optical Emission Spectrochemical Analysis) method can be used.

The maximum value of a ratio of the number of each atomic element constituting an (N, C, F) layer to the number of Si atoms is preferably in the range of 0.5 to 1.5. By so doing, it is possible to effectively exhibit barrier action caused by an (N, C, F) layer without deteriorating TFT properties. The maximum value of the ratio is yet preferably 0.6 or more and still yet preferably 0.7 or more. The ratio can be adjusted for example by controlling a plasma irradiation time in the range of about 5 sec. to 10 min. The ratio can be computed by analyzing elements (N, C, F, and Si) in the depth direction of an (N, C, F) layer by an RBS method.

An (N, C, F) layer can be formed by forming a semiconductor layer and thereafter supplying at least any one of nitrogen, carbon, and fluorine to the surface of the semiconductor layer. More specifically, the layer can be formed by using plasma containing any one of them. Otherwise as described in Patent Literature 9, it is possible to form a nitrogen containing layer by a thermal nitridation method or an amination method. Patent Literature 9 may be referred to with regard to the details of the thermal nitridation method and the amination method.

A method for using plasma is explained hereunder in detail. A gas containing at least one of nitrogen, carbon, and fluorine can be used in plasma. As gases that can be used for example, named are: nitrogen containing gases such as $N_2$, $NH_3$, $N_2O$, and NO; nitrogen and fluorine containing gases such as $NF_3$; carbon containing gases such as CO, $CO_2$, and hydrocarbon gases (for example, $CH_4$, $C_2H_4$, and $C_2H_2$); and carbon and fluorine containing gases such as fluorocarbon gases (for example, $CF_4$ and $C_4F_8$) and $CHF_3$. Those gases can be used separately or as a mixed gas.

Meanwhile, as a method for supplying at least one of nitrogen, carbon, and fluorine to the surface of a semiconductor layer from a plasma source containing one of the above gases for example, a method of disposing a semiconductor layer in the vicinity of the plasma source is named. Here, the distance between the plasma source and the semiconductor layer may be set appropriately in accordance with various parameters such as the type of plasma, power, pressure, and temperature in plasma generation, and others but in general a distance of several cm to 10 cm from the state of touching plasma can be used. In the vicinity of plasma, atoms having high energies exist and hence it is possible to: supply nitrogen, carbon, fluorine, or the like to the surface of a semiconductor layer by the high energies; and thereby form nitride, carbide, fluoride, or the like over the surface of the semiconductor layer.

Besides the above method, an ion implantation method may also be used for example. By the method, ions are accelerated by an electric field and can move over a long distance and hence the distance between a plasma source and a semiconductor layer can be set arbitrarily. The method can be applied by using a dedicated ion implantation device and a plasma ion implantation method is preferably used. The plasma ion implantation method is a technology of implanting ions uniformly by applying high negative voltage pulses to a semiconductor layer disposed in the vicinity of plasma.

When an (N, C, F) layer is formed, it is preferable to control a device and a chamber used for forming the layer, a temperature, and a gas composition as follows from the viewpoints of the simplification of manufacturing processes, the shortening of a processing time, and the like.

Firstly with regard to equipment, for simplifying manufacturing processes, it is preferable to carry out processes in equipment identical to semiconductor layer forming equipment and yet preferable to carry out processes in an identical chamber of identical equipment. By so doing, it comes to be unnecessary to additionally transfer a processing object between equipment or in equipment. With regard to temperature, it is preferable to carry out processes at a temperature substantially identical to a semiconductor layer forming temperature (including the range of about ±10° C.) and thereby it is possible to omit adjustment time accompanying temperature change.

Further with regard to a gas composition, (I) an (N, C, F) layer may be formed by using a gas containing at least one element selected from the group consisting of nitrogen, carbon, and fluorine (a nitrogen containing gas, a carbon containing gas, or a fluorine containing gas), (II) an (N, C, F) layer may be formed by using a mixed gas comprising a gas containing at least one element selected from the group consisting of nitrogen, carbon, and fluorine and a source gas used for forming a semiconductor layer, or (III) an (N, C, F) layer may be formed by using a mixed gas comprising a gas containing at least one element selected from the group consisting of nitrogen, carbon, and fluorine and a reductive gas. In the case of forming a nitrogen containing layer for example, it is possible to use only a nitrogen containing gas ($N_2$, $NH_3$, $NF_3$, or the like) containing at least nitrogen like the case (I) but it is preferable to use a mixed gas comprising a nitrogen containing gas and a source gas ($SiH_4$) used for forming a semiconductor layer like the case (II). When a nitrogen containing layer is formed by using only a nitrogen containing gas, the used semiconductor layer forming gas has to be completely evacuated once in order to purge the interior of a chamber after the semiconductor layer is formed. If an (N, C, F) layer is formed under the condition of a mixed gas as stated above however, a gas is not required to be evacuated and hence processing time can be shortened.

In the case (II), the flow ratio ((N, C, F) gas/semiconductor source gas) of a gas containing at least one element selected from the group consisting of nitrogen, carbon, and fluorine (hereunder referred to as a "(N, C, F) gas", a nitrogen containing gas in particular) to a source gas used for forming a semiconductor layer (hereunder referred to as a "semiconductor source gas") is preferably controlled to 0.10 or more and 15 or less and thereby the effect of shortening processing time can be exhibited effectively, the insulation of a barrier layer improves, and the deterioration of TFT properties (on-state current/off-state current) and the increase of contact resistance can be prevented. If an (N, C, F) gas is too little, the interdiffusion prevention effect by Cu—Si is not exhibited effectively. If an (N, C, F) gas is excessive in contrast, the bond in the thin film layer comes to be unstable. A flow ratio ((N, C, F) gas/semiconductor source gas) is yet preferably 0.3 or more and 10 or less and still yet preferably 0.5 or more and 7 or less.

Otherwise, with regard to a gas composition, a mixed gas comprising a nitrogen containing gas and a reductive element containing gas like the case (III) is preferably used and by so doing the oxidation of a semiconductor layer can be suppressed further effectively. As reductive elements for example, $NH_3$ and $H_2$ are named. $NH_3$ not only has reductive action but also acts as a nitrogen containing gas and hence $NH_3$ can be used separately and also can be used by being mixed with $H_2$.

Successively, a Cu alloy film used in the present invention is explained. A Cu alloy film may be formed by a sputtering method for example. In the present invention, a Cu alloy film can be formed by using a single sputtering target and a single sputtering gas.

The type of a Cu alloy film used in the present invention is not particularly limited and a pure Cu film used usually as a wiring material for a source/drain wiring can be used without modification as long as it does not adversely affect electrical properties such as TFT properties.

Otherwise, as described in the related art, it is also possible to use a Cu—X alloy film containing at least one element selected from the group (group X) composed of Ni, Zn, Mg, Mn, Ir, Ge, Nb, Cr, and rare-earth elements as a wiring material.

Here, the content of the elements belonging to the group X is preferably in the range of about 0.01 at. % to 3 at. %. If the content of the elements belonging to the group X is less than 0.01 at. %, an intended effect is not obtained. If it exceeds 3 at. % in contrast, the electric resistivity of a Cu—X alloy thin film increases extremely, the response speed of pixels lowers, power consumption increases, quality as a display deteriorates, and the device is not practically used. A content of the elements belonging to the group X is preferably 0.05 at. % or more and 2.0 at. % or less.

The thickness of a Cu alloy film can be appropriately adjusted in accordance with required TFT properties and the like and it is preferably about 10 nm to 1 µm, yet preferably 30 nm to 800 nm, and still yet preferably 50 nm to 600 nm.

Further, the thickness of a Cu—Si diffusion layer also can be appropriately adjusted in accordance with required TFT properties and the like in the same way and it is preferably in the range of about 0.2 nm to 200 nm and yet preferably in the range of 1 nm to 50 nm. More specifically, the thickness may be thicker than the thickness (about 0.2 nm) corresponding to one atom layer of Cu—Si and the upper limit is set at about 200 nm on the basis of the thought that the thickness should be as thin as possible from the viewpoint of TFT manufacturing.

A semiconductor layer used in the present invention preferably comprises amorphous silicon or polysilicon. Here, when a semiconductor layer contains an impurity (a dopant), such as P, As, Sb, or B, used generally in a semiconductor field, the atomic concentration is preferably $10^{19}$ cm$^{-3}$ or more in total and thereby a contact resistance can be lowered further. Further, even when the atomic concentration is not more than $10^{15}$ cm$^{-3}$ and a dopant is not contained, good TFT properties can be obtained without increasing a contact resistance considerably. On this occasion, a doping gas is not used and hence the advantage that costs and manufacturing processes can be reduced is obtained.

The thickness of a semiconductor layer is preferably 0.2 nm to 1 μm which nearly corresponds to the thickness of a silicon atomic layer. The thickness of a semiconductor layer is yet preferably 0.5 nm to 500 nm and still yet preferably 1 nm to 300 nm.

The embodiment shown in FIG. 1A has heretofore been described in detail.

Here, the embodiment shown in FIG. 1A can include both the embodiments shown in FIGS. 1B and 1C on the basis of the configuration of a first semiconductor layer formed over a TFT substrate. A first semiconductor layer in FIG. 1B comprises an undoped amorphous silicon film (a-Si—H) not containing impurities such as P, As, Sb, and B and a low-resistance doped amorphous silicon film (n$^+$a-Si—H) containing the above impurities in this order from the substrate side and can be obtained for example by a method adopted in Example 1 that will be described later. Meanwhile, a first semiconductor layer in FIG. 1C does not contain a low-resistance amorphous silicon film (n$^+$a-Si—H) and comprises only an undoped amorphous silicon film (a-Si—H). It is confirmed by experiments that, even when a nitrogen containing layer, a second semiconductor layer, and a Cu alloy layer are formed in sequence directly over a first semiconductor layer not having a low-resistance amorphous silicon film (n$^+$a-Si—H) as shown in FIG. 1C, an intended Cu—Si diffusion layer can be obtained (refer to after-mentioned examples). By a method according to the present invention, the advantage that film forming processes are further simplified on the point that a low-resistance amorphous silicon film (n$^+$a-Si—H) doped with impurities such as phosphorus may not necessarily be formed can be obtained.

Here, although it is not shown in the figures, a second semiconductor layer formed over a nitrogen containing layer either may comprise only a low-resistance amorphous silicon film containing impurities such as P as shown in Example 1 that will be described later or may comprise an undoped amorphous silicon film and the low-resistance amorphous silicon film, and either of the embodiments can be included. A low-resistance amorphous silicon film can be formed by using SiH$_4$ and PH$_3$ as the materials and applying plasma CVD for example.

Second Embodiment According to the Present Invention

The second embodiment of a TFT according to the present invention represents an example in which a first semiconductor layer, an (N, C, F) layer, and a first semiconductor layer are formed between a nitrogen containing layer constituting a double-layered laminated structure in the first embodiment and a TFT substrate. More specifically, as shown in FIG. 2: a first semiconductor layer, an (N, C, F) layer, and a first semiconductor layer are formed over a TFT substrate; a double-layered laminated structure comprising an (N, C, F) layer and a Cu—Si diffusion layer is formed directly thereover; and a Cu alloy layer is formed further directly thereover. The structure shown in FIG. 2 can be obtained by a method of Example 2 that will be described later for example. Here, other conditions, properties, and others are the same as those described in the first embodiment.

Third Embodiment According to the Present Invention

Figure 6:
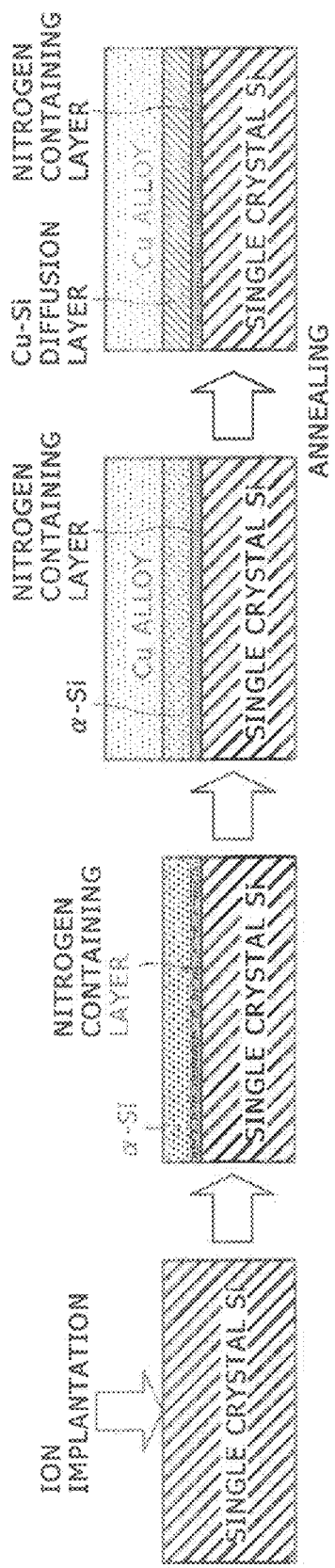
FIG. 6 is a process chart explaining individual processes for forming a wiring structure according to the third embodiment of the present invention.

The third embodiment of a MOSFET according to the present invention is shown in FIG. 5. FIG. 5 shows a structure in which a double-layered laminated structure comprising an (N, C, F) layer and a Cu—Si diffusion layer is formed directly over single crystal Si and a Cu alloy layer is formed directly thereover. Such a structure can be formed through the processes shown in FIG. 6. That is, an (N, C, F) gas (preferably nitrogen gas) is injected into a single crystal Si substrate by anion implantation method or the like. On this occasion, the injected (N, C, F) gas (preferably nitrogen gas) distributes in the depth direction so as to nearly form a Gaussian distribution around a certain depth (referred to as a "range"). A part of Si comes to be amorphous by the damage of the injected (N, C, F) gas (preferably nitrogen gas). Successively, a Cu alloy film is formed by sputtering and plating and subsequently, by applying heat treatment such as annealing, a Cu alloy film/Cu—Si diffusion layer/(N, C, F) layer (preferably nitrogen containing layer)/single crystal Si structure is formed. Here, other conditions, properties, and others are the same as those described in the first embodiment.

Fourth Embodiment According to the Present Invention

The fourth embodiment of a MOSFET according to the present invention is shown in FIG. 1C. FIG. 1C shows an example of a structure in which a first semiconductor layer, an (N, C, F) layer, and a first semiconductor layer are formed between a nitrogen containing layer constituting a double-layered laminated structure in the first embodiment described above and a TFT substrate. More specifically, as shown in FIG. 1C, a first semiconductor layer and a double-layered laminated structure comprising an (N, C, F) layer and a Cu—Si diffusion layer are formed over a TFT substrate, and a Cu alloy layer is formed directly thereover. In the fourth embodiment, the first semiconductor layer is not doped with impurities (P). The structure shown in FIG. 1C can be obtained by a method similar to a method in Example 1 that will be described later for example. On this occasion, an undoped amorphous silicon film is formed, thereafter only a nitrogen gas is supplied continuously and plasma is generated in an identical chamber, nitrogen plasma is applied to the side of the amorphous silicon film for 30 sec., and thus a nitrogen containing layer is formed. Here, other conditions, properties, and others are the same as those described in the first embodiment.

The embodiment has the same wiring structure as the first embodiment of a TFT. The embodiment of a MOSFET is not limited to the above structure and a structure substantially identical to the first and second embodiments of a TFT can be adopted for example.

A method for manufacturing a MOSFET (Metal-Oxide-Semiconductor Field Effect Transistor) is explained in reference to a process chart shown in FIG. 11. Here, processes for forming an element isolation pattern over a single crystal p-type Si substrate by a local oxidation (LCOS: Local Oxidation of Si) method and manufacturing a MOSFET in an active region (a region not subjected to local oxidation) of an element are explained. Explanations are hereunder made on the basis of an example in which polysilicon and a nitrogen gas as an (N, C, F) gas are used but it does not mean that the present invention is limited to the example.

Firstly, a gate insulation film is formed over a single crystal p-type Si substrate by thermal oxidation or the like (FIG. 11A). Successively, a p-doped polysilicon film is formed by CVD or the like (FIG. 11B). Thereafter, a resist is patterned by lithography (FIG. 11C). The polysilicon is etched by dry etching while the resist is used as a mask (FIG. 11D). Successively, a source/drain region is formed by injecting As into the substrate by an ion implantation method or the like and applying activation annealing (FIG. 11E). Successively, an interlayer insulation film is formed by CVD or the like (FIG. 11F). By applying patterning by lithography (FIG. 11G) and applying dry etching, contact holes for connecting a metal wiring film (a Cu alloy film) to the source/drain region are formed (FIG. 11H). Successively, a Cu alloy film/Cu—Si diffusion layer/nitrogen containing layer/single crystal Si structure is formed through the processes shown in FIG. 6 stated earlier. That is, nitrogen is injected into a substrate by an ion implantation method or the like. On this occasion, the injected nitrogen distributes in the depth direction so as to nearly form a Gaussian distribution around a certain depth (referred to as a "range"). A part of Si comes to be amorphous by the damage of the injected nitrogen (FIG. 11I). Successively, a Cu alloy film is formed by sputtering and plating (FIG. 11J) and processed into a wiring pattern by applying CMP (Chemical Mechanical Polish). By applying annealing finally, a MOSFET having a Cu—Si diffusion layer is obtained (FIG. 11K).

EXAMPLES

Although the present invention is hereunder explained more specifically in reference to examples, the present invention is not restricted by the following examples and can be modified within a range conforming to the previously and posteriorly mentioned gist, and all the modifications are included in the technological scope of the present invention.
(1) With Regard to Experiment Group Shown in Table 1

In Examples 1 to 6, Comparative Example 1, and Conventional Example 1 shown in Table 1, annealing is applied to a TFT shown in FIG. 4 manufactured in accordance with the process chart shown in FIG. 4 for 30 min. at 300° C. in order to easily measure TFT properties and the like. The annealing conditions are set on the premise of heat treatment in the process for forming a Si nitride film (protective film) where the temperature is the highest in the processes for manufacturing a TFT substrate. The TFT used in the present example is not a product completed by passing through various film forming processes like an actual TFT substrate but it is estimated that a TFT subjected to annealing described above nearly reflects TFT properties of an actual TFT substrate.

Example 1

Example 1 is the case of a wiring structure according to the aforementioned first embodiment (refer to FIG. 1A) and Cu-0.3 at. % Ni is used as a wiring material constituting a source/drain electrode.

A manufacturing method according to Example 1 is explained in reference to the process chart shown in FIG. 4.

Firstly, a Cu alloy thin film (Cu-0.3 at. % Ni) about 200 nm in thickness is formed over a glass substrate by a sputtering method (FIG. 4A). The film forming temperature at sputtering is set at room temperature. A resist is patterned over the Cu alloy thin film by photolithography (FIG. 4B) and thereafter a gate electrode is formed by using the resist as a mask and etching the Cu alloy thin film (FIG. 4C).

Successively, a silicon nitride film (SiN) about 200 nm in thickness is formed by a plasma CVD method and used as a gate insulation film (FIG. 4D). The film forming temperature in the plasma CVD method is set at about 350° C. By using the plasma CVD method further, an undoped amorphous silicon film [α-Si(i)] about 200 nm in thickness and a low-resistance amorphous silicon film [α-Si(n)] about 40 nm in thickness doped with impurities (P) are formed in sequence (FIGS. 4E and 4F). The low-resistance amorphous silicon film [α-Si(n)] is formed by using $SiH_4$ and $PH_3$ as the materials and applying plasma CVD. The film forming temperature of the plasma CVD is set at 320° C.

Successively, a nitrogen containing layer is formed by supplying only a nitrogen gas, generating plasma, and processing the surface of the low-resistance amorphous silicon film by nitrogen plasma for 30 sec. in an identical chamber of identical plasma CVD equipment (FIG. 4G). The radio-frequency (RF) power density applied to the plasma is set at about 0.3 W/cm², the film forming temperature is set at 320° C., and the gas pressure is set at 67 Pa. As a result of analyzing the surface by an RBS method and an XPS method, it is confirmed that a nitrogen containing layer about 5 nm in thickness is formed.

Thereafter, a low-resistance amorphous silicon film [α-Si (n)] doped with impurities (P) is formed again continuously without extracting the material from the CVD equipment. On this occasion, the thickness of the low-resistance amorphous silicon film is set at about 10 nm (FIG. 4H).

Successively, a Cu alloy film (Cu-0.3 at. % Ni) about 300 nm in thickness is formed thereover by a sputtering method (FIG. 4I). The film forming temperature at sputtering is set at room temperature. Successively, a source electrode and a drain electrode are formed as shown in FIG. 4J by patterning a resist by photolithography, thereafter using the resist as a mask, and etching the Cu alloy film. Further, the source electrode and the drain electrode are used as masks, the whole low-resistance amorphous silicon film [α-Si (n)] is removed by dry etching (FIG. 4K), and thereby a TFT having a Cu—Si diffusion layer between the nitrogen containing layer and the Cu alloy film is formed (FIG. 4L). The thickness of the Cu—Si diffusion layer is about 10 nm.
(Evaluation of TFT Properties)

With a TFT as manufactured above, switching properties of the TFT in drain current-gate voltage are investigated. By this method too, the interdiffusion between Si and Cu can be evaluated indirectly. Here, a leak current flowing when a TFT is switched off (a drain current value when a negative voltage is applied as gate voltage, off-state current) and an on-state current flowing when a TFT is switched on are measured as follows.

A drain current and a gate voltage are measured with a TFT of 10 µm in gate length (L), 100 µm in gate width (W), and thus 10 in W/L ratio. The drain voltage at the time of the measurement is set at 10 V. An off-state current is defined as a current when a gate voltage (−3 V) is applied and an on-state current is defined as a voltage when a gate voltage is 20 V.

More specifically, a TFT of Example 1 is annealed for 30 min. at 300° C., thereafter an off-state current and an on-state current are measured, and as a result the off-state current is $3.7 \times 10^{-13}$ A and the on-state current is $1.6 \times 10^{-6}$ A. For comparison, a TFT is manufactured likewise as a conventional example by using a conventional source-drain electrode comprising a pure Cu thin film and a Mo barrier metal layer and the TFT properties are measured. As a result, the off-state current is $4.0 \times 10^{-13}$ A and the on-state current is $1.6 \times 10^{-6}$ A in Conventional Example 1. The results are shown in Table 1.

From the above results, it is confirmed that: the TFT of Example 1 has excellent TFT properties comparable to those of the TFT of Conventional Example 1 in which a barrier metal layer is interposed; and interdiffusion between the amorphous silicon film and the Cu alloy film 1 does not occur.
(Evaluation of Interdiffusion Between Si and Cu)

A section of an interface between an amorphous silicon film and a Cu alloy film after annealed is observed by TEM (magnifications of 300,000 and 1,500,000) and the behavior of interdiffusion between Si and Cu is evaluated. Sectional TEM images of the interface are shown in FIG. 7. As shown in FIG. 7, Cu diffuses into a low-resistance amorphous silicon film existing thereunder by heat treatment at 300° C., thus a Cu—Si diffusion layer is formed, and a distinct interface layer is observed between the amorphous silicon film and the Cu alloy film. In Example 1 therefore, it is confirmed that a laminated structure comprising a nitrogen containing layer and a Cu—Si diffusion layer is formed over the amorphous silicon film. Further, as a result of semi-quantitative analysis by an EDX method, it is found that a Cu element is scarcely detected in the low-resistance amorphous silicon film and the diffusion of Cu is inhibited at the upper layer of the low-resistance amorphous silicon film.
(Measurement of Contact Resistance)

Figure 8:
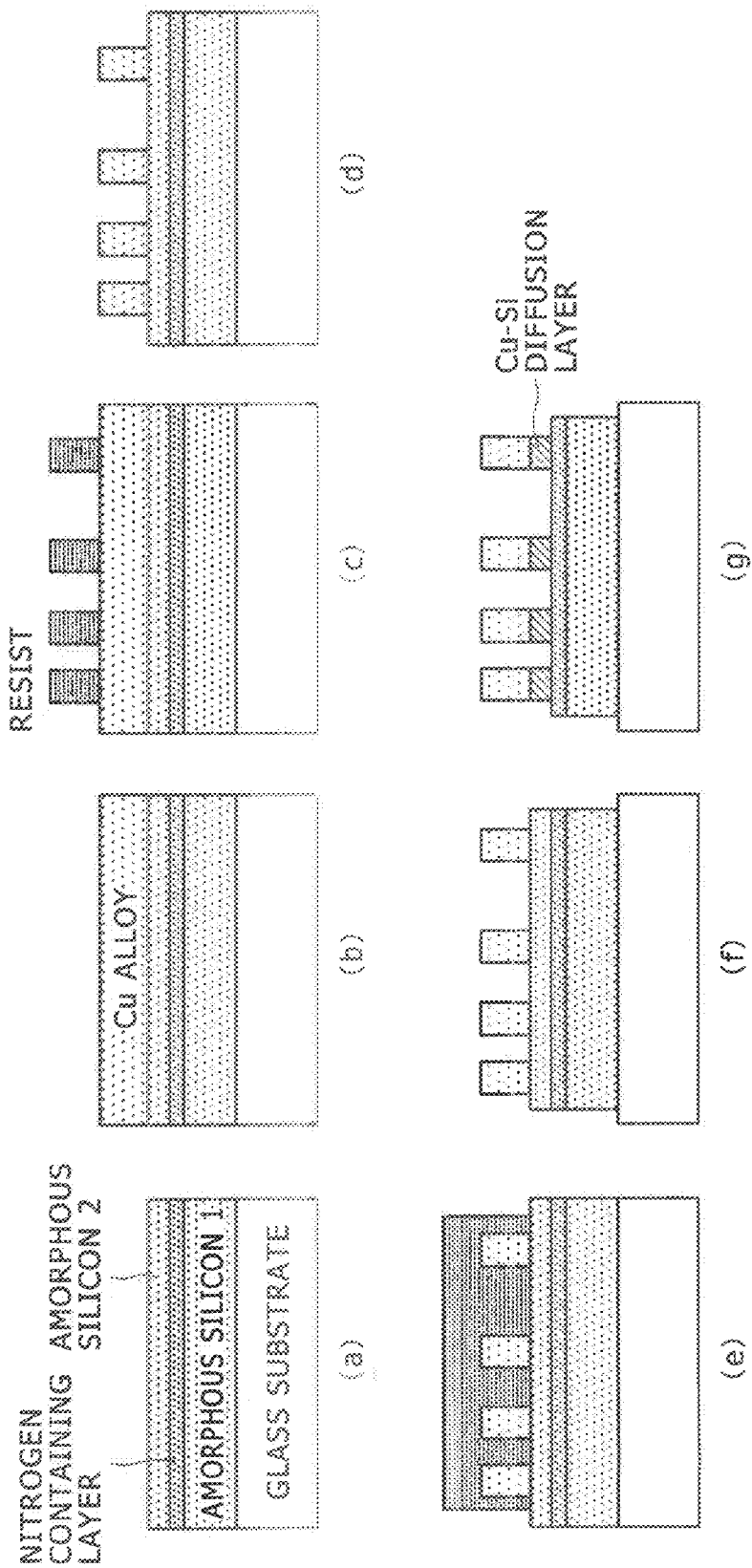
FIG. 8 is a process chart explaining processes for forming a TLM element manufactured in order to investigate a contact resistance between a Cu alloy film and a semiconductor layer (amorphous silicon).

In order to investigate a contact resistance between a Cu alloy film and a semiconductor layer (amorphous silicon film), a TLM element is formed by a TLM (Transfer Length Method) in accordance with the process chart shown in FIG. 8.

Figure 9:
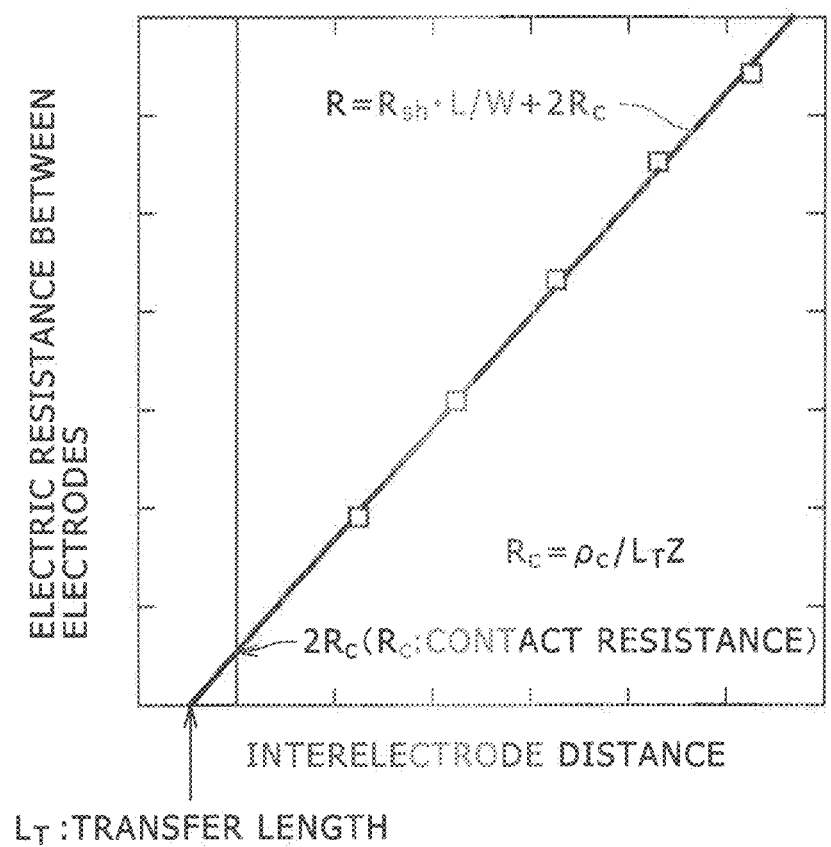
FIG. 9 is a graph showing the relationship between an interelectrode distance and an electric resistance.

Firstly a method for manufacturing a TLM element is explained in reference to FIG. 8 and successively the measurement principle of a TLM is explained in reference to FIGS. 9 and 10.

Firstly, a low-resistance amorphous silicon film 1 about 200 nm in thickness doped with impurities (P) is formed over a glass substrate by a plasma CVD method. Successively, in identical plasma CVD equipment, only a nitrogen gas is supplied and plasma is generated, the nitrogen plasma is applied to the surface of the low-resistance amorphous silicon film 1 for 30 sec., and thus a nitrogen containing layer is formed (FIG. 8A). The RF power density applied to the plasma is set at about 0.3 W/cm², the film forming temperature is set at 320° C., and the gas pressure is set at 67 Pa.

Successively, a low-resistance amorphous silicon film 2 doped with impurities (P) is formed again continuously without extracting the material from the CVD equipment (FIG. 8A). The thickness of the low-resistance amorphous silicon film 2 is set at 10 nm. A Cu alloy film (Cu-0.3 at. % Ni) about 300 nm in thickness is formed thereover (FIG. 8B). A resist is patterned by photolithography (FIG. 8C), thereafter the Cu alloy film is etched by using the resist as a mask, and thereby a plurality of electrodes shown in FIG. 8D are formed. Here, the distance between electrodes is variously changed. Further, dry etching is applied again and a resist is patterned by photolithography. On this occasion, all the electrode patterns are covered with the resist as shown in FIG. 8E. The low-resistance amorphous silicon film at the periphery of the electrode pattern is removed by using the resist as a mask (FIG. 8F). Finally, heat treatment is applied for 30 min. at 300° C. and a Cu—Si diffusion layer is formed (FIG. 8G).

Successively, the measurement principle of a contact resistance by a TLM is explained in reference to FIGS. 9 and 10. FIG. 10A is a sectional view schematically showing the wiring structure shown in FIG. 8G and FIG. 10B is a top view of the structure shown in FIG. 8G. In FIG. 10A, a Cu—Si diffusion layer is omitted.

Firstly, in the wiring structure shown in FIG. 8G, current-voltage properties between plural electrodes are measured and resistance values between electrodes are obtained. The resistance values between the electrodes thus obtained are plotted along the vertical axis, interelectrode distances (transfer length: L) are plotted along the horizontal axis, and thereby the graph shown in FIG. 9 is obtained. In the graph shown in FIG. 9, the value of the y-intercept corresponds to the double of the contact resistance Rc (2Rc) and the value of x-intercept corresponds to the effective contact length ($L_T$: Transfer length), respectively. Consequently, a contact resistivity $\rho_c$ is represented by the following expression;

$$\rho_c = Rc * L_T * Z.$$

In the expression, Z represents an electrode width as shown in FIG. 10B.

The results are shown in Table 1. From Table 1, it is understood that the TFT of Example 1 has a good contact resistance.
(Measurement of Element Area Density at Interface Between Semiconductor Layer and Cu Alloy Film)

With regard to Example 1, an area density of nitrogen atoms (N1) and an area density of oxygen atoms (O1) are measured with a high resolution RBS analyzer "HRSB500" made by Kobe Steel, Ltd. As a result, it is confirmed that the N atom area density (N1) of Example 1 is $6.8 \times 10^{15}$/cm², the O atom area density (O1) of Example 1 is lower than the detection limit, and good TFT properties are obtained.

Example 2

Example 2 is the case of a wiring structure according to the second embodiment (refer to FIG. 2) and Cu-0.3 at. % Ni that is identical to the case of Example 1 is used as the wiring material constituting a source/drain electrode.

A TFT of Example 2 is manufactured in the same way as Example 1 except that the process for applying nitrogen plasma again for 30 sec. and forming a low-resistance amorphous silicon film of 10 nm doped with impurities (P) continuously without extracting the material from CVD equipment is added after a low-resistance amorphous silicon film shown in FIG. 4H is formed in Example 1.

The TFT obtained in Example 2 is annealed for 30 min. at 300° C. in the same way as Example 1 and a section of the interface between the amorphous silicon film and the Cu alloy film after annealed is observed by TEM and analyzed by EDX. As a result, it is found that Cu atoms are scarcely detected in the amorphous silicon film and the diffusion of Cu is inhibited at the upper layer of the amorphous silicon film in the same way as Example 1 (not shown in the figure).

Further, an off-state current and an on-state current in Example 2 are measured in the same way as Example 1 and as a result the off-state current is $3.3 \times 10^{-13}$ A and the on-state current is $1.7 \times 10^{-6}$ A. Consequently, it is found that the TFT of Example 2 has good TFT properties comparable to the TFT of Conventional Example 1.

Furthermore, a contact resistance is measured in the same way as Example 1 except that nitrogen plasma treatment is applied again and a row-resistance amorphous silicon film of 10 nm is formed after a row-resistance amorphous silicon film of 10 nm is formed in Example 1. The results are shown in Table 1 and it is confirmed that the TFT of Example 2 has a good contact resistance.

Example 3

Example 3 is the case of a wiring structure according to the fourth embodiment (refer to FIG. 1C) and Cu-0.3 at %. Ni that is identical to the case of Example 1 is used as the wiring material constituting a source/drain electrode.

A TFT of Example 3 is manufactured in the same way as Example 1 except that nitrogen plasma is applied again for 30 sec. continuously without extracting the material from the CVD equipment after an undoped amorphous silicon film shown in FIG. 4E is formed in Example 1.

The TFT obtained in Example 3 is annealed for 30 min. at 300° C. in the same way as Example 1 and a section of the interface between the undoped amorphous silicon and the Cu alloy after annealed is observed by TEM and analyzed by EDX. As a result, it is found that Cu atoms are scarcely detected in the undoped amorphous silicon film and the diffusion of Cu is inhibited at the upper layer of the undoped amorphous silicon film in the same way as Example 1 (not shown in the figure).

Further, an off-state current and an on-state current in Example 3 are measured in the same way as Example 1 and as a result the off-state current is $4.2 \times 10^{-13}$ A and the on-state current is $1.6 \times 10^{-6}$ A (refer to Table 1). Consequently, it is found that the TFT of Example 3 has good TFT properties comparable to the TFT of Conventional Example 1.

Furthermore, in order to investigate a contact resistance in Example 3, a contact resistance is measured in the same way as Example 1 except that the undoped amorphous silicon film of 10 nm is formed unlike Example 1. The results are shown in Table 1 and it is found that the TFT of Example 3 has a good contact resistance.

Example 4

Example 4 is the case of a wiring structure according to the first embodiment (refer to FIG. 1A) and a TFT of Example 4 is manufactured in the same way as Example 1 except that pure Cu is used as the wiring material constituting a source/drain electrode unlike Example 1.

With regard to the TFT obtained in Example 4, an off-state current, an on-state current, and a contact resistance are measured in the same way as Example 1. The results are shown in Table 1.

Example 5

Example 5 is the case of a wiring structure according to the first embodiment (refer to FIG. 1A) and a TFT of Example 5 is manufactured in the same way as Example 1 except that Cu-0.1 at. % Ge is used as the wiring material constituting a source/drain electrode unlike Example 1.

With regard to the TFT obtained in Example 5, an off-state current, an on-state current, and a contact resistance are measured in the same way as Example 1. The results are shown in Table 1.

Example 6

Example 6 is the case of a wiring structure according to the first embodiment (refer to FIG. 1A) and a TFT of Example 6 is manufactured in the same way as Example 1 except that Cu-0.5 at. % Mn is used as the wiring material constituting a source/drain electrode unlike Example 1.

With regard to the TFT obtained in Example 6, an off-state current, an on-state current, and a contact resistance are measured in the same way as Example 1. The results are shown in Table 1.

From Table 1, it is found that, in any of the TFTs of Examples 4 to 6, good TFT properties and a good contact resistance that are comparable to those of the TFT of Conventional Example 1 are obtained.

Comparative Example 1

Comparative Example 1 is the case of a wiring structure according to the first embodiment (refer to FIG. 1A) not having a nitrogen containing layer and the same Cu alloy as Example 1 is used as the wiring material constituting a source/drain electrode. More specifically, a TFT of Comparative Example 1 is manufactured in the same way as Example 1 except that a process for forming a nitrogen containing layer is not adopted unlike Example 1.

With regard to the TFT obtained in Comparative Example 1, an off-state current and an on-state current are measured in the same way as Example 1. The results are shown in Table 1.

From Table 1, it is found that the TFT of Comparative Example 1 has conspicuously lower TFT properties than the conventional example has and does not function as a TFT.

Further, the TFT of Comparative Example 1 is annealed for 30 min. at 200° C. that is lower than the temperature of Example 1 and a section of the interface between the amorphous silicon and the Cu alloy after annealed is observed by TEM and analyzed by EDX. As a result, it is confirmed that voids are observed in the Cu alloy film and the amorphous silicon film in spite of the fact that low temperature treatment of 200° C. is applied and conspicuous interdiffusion occurs (not shown in the figure). Furthermore, from semi-quantitative analysis by EDX too, diffusion of Cu into the amorphous silicon film and diffusion of Si into the Cu alloy film are confirmed.

TABLE 1

| No. | Remarks | Source/drain electrode | Nitrogen containing layer | Wiring structure | On-state current (A) | Off-state current (A) | Contact resistance ($\Omega \cdot cm^2$) |
|---|---|---|---|---|---|---|---|
| 1 | Example 1 | Cu—0.3Ni | Exist | First embodiment (FIG. 1A) | $1.6 \times 10^{-6}$ | $3.7 \times 10^{-13}$ | 0.25 |
| 2 | Example 2 | Cu—0.3Ni | Exist | Second embodiment (FIG. 2) | $1.7 \times 10^{-6}$ | $3.3 \times 10^{-13}$ | 0.18 |
| 3 | Example 3 | Cu—0.3Ni | Exist | Fourth embodiment (FIG. 1C) | $1.6 \times 10^{-6}$ | $4.2 \times 10^{-13}$ | 0.30 |
| 4 | Example 4 | Pure Cu | Exist | First embodiment (FIG. 1A) | $1.7 \times 10^{-6}$ | $4.0 \times 10^{-13}$ | 0.10 |
| 5 | Example 5 | Cu—0.1Ge | Exist | First embodiment (FIG. 1A) | $1.6 \times 10^{-6}$ | $3.1 \times 10^{-13}$ | 0.20 |
| 6 | Example 6 | Cu—0.5Mn | Exist | First embodiment (FIG. 1A) | $1.7 \times 10^{-6}$ | $3.7 \times 10^{-13}$ | 0.14 |
| 7 | Conventional Example 1 | Mo + Pure Cu | Not exist | First embodiment (FIG. 1A) | $1.6 \times 10^{-6}$ | $4.0 \times 10^{-13}$ | 0.30 |
| 8 | Comparative Example 1 | Cu—0.3Ni | Not exist | First embodiment (FIG. 1A) | $1.5 \times 10^{-6}$ | $2.0 \times 10^{-11}$ | Not evaluated |

(2) With Regard to Experiment Group Shown in Table 2

All the examples in the experiment group (Examples 7 to 18 and Comparative Examples 2 to 9) shown in Table 2 are the cases of wiring structures according to the first embodiment (refer to FIG. 1A). Here, nitrogen containing layers are formed by using pure Cu (Nos. 6 to 10 in Table 2) or a Cu alloy (Nos. 1 to 5 and 11 to 20 in Table 2) shown in Table 2 as the wiring materials constituting source/drain electrodes and changing the flow ratio of a nitrogen gas to a semiconductor source gas in a mixed gas in the range shown in Table 2, and the influence on TFT properties and contact resistance is investigated.

Example 7

Example 7 is the case of forming a nitrogen containing layer by using a mixed gas (flow ratio: 0.3) comprising a nitrogen gas and a semiconductor source gas instead of a nitrogen gas used in Example 1.

Firstly, in the same way as Example 1, a gate electrode of a Cu alloy thin film (Cu-0.3 at. % Ni) is formed over a glass substrate and thereafter a gate insulation film of a silicon nitride film (SiN), an undoped amorphous silicon film [a-Si (i)], and a low-resistance amorphous silicon film [the first low-resistance a-Si(n)] doped with impurities (P) are formed in sequence.

Successively, in an identical chamber of identical plasma CVD equipment, a semiconductor layer forming gas comprising $SiH_4$: 30 sccm, $PH_3$: 0.2 sccm, and $N_2$: 10 sccm (flow ratio of nitrogen gas/semiconductor source gas=0.3) is supplied, plasma is generated for 10 sec., and thereby a nitrogen containing layer is formed. As a result of analyzing the surface by an RBS method and an XPS method, it is confirmed that a nitrogen containing layer about 5 nm in thickness is formed.

Thereafter, a low-resistance amorphous silicon film [the second low-resistance a-Si(n)] 10 nm in thickness doped with impurities (P) in the same way as Example 1 is formed again. Thereafter, in the same way as Example 1, a TFT of Example 7 having a Cu—Si diffusion layer between the nitrogen containing layer and the Cu alloy film is manufactured. The thickness of the nitrogen containing layer is about 5 nm and the thickness of the Cu—Si diffusion layer is about 10 nm.
(Evaluation of TFT Properties)

With regard to the TFT obtained in Example 7, an off-state current and an on-state current are measured in the same way as Example 1. The results are shown in Table 2 and it is found that the TFT of Example 7 has good TFT properties comparable to the TFT of the conventional example stated earlier.
(Measurement of Contact Resistance)

Further, a TLM element is formed by a TLM method in the same way as Example 1 in order to investigate a contact resistance in Example 7. More specifically, the contact resistance is measured in the same way as Example 1 except that the condition (composition of gas and flow ratio of gas) for forming a nitrogen containing layer in a TLM element shown in FIG. 10 is changed to a semiconductor layer forming gas comprising $SiH_4$: 30 sccm, $PH_3$: 0.2 sccm, and $N_2$: 10 sccm [flow ratio of nitrogen gas (10 sccm)/semiconductor source gas (30 sccm+0.2 sccm)=0.3] from the case of Example 1. The results are shown in Table 2 and it is confirmed that the TFT of Example 7 has a good contact resistance.

Example 8

Example 8 is the case where the flow ratio of nitrogen gas/semiconductor source gas is changed to 3.3 from the case of Example 7.

More specifically, a TFT of Example 8 is manufactured in the same way as Example 7 except that the nitrogen containing layer forming condition is changed to a semiconductor layer forming gas comprising $SiH_4$: 30 sccm, $PH_3$: 0.2 sccm, and $N_2$: 100 sccm [flow ratio of nitrogen gas (100 sccm)/semiconductor source gas (30 sccm+0.2 sccm)=3.3] from the case of Example 7. The thickness of the nitrogen containing layer is about 5 nm similarly to Example 7.

With regard to the TFT obtained in Example 8, in the same way as Example 7, a section of the interface between the amorphous silicon film and the Cu alloy film after annealed for 30 min. at 300° C. is observed by TEM and analyzed by EDX and interdiffusion between Si and Cu is evaluated. As a result, it is found that Cu atoms are scarcely detected in the amorphous silicon film and the diffusion of Cu is inhibited at the upper layer of the amorphous silicon film in the same way as Example 7. Here, the thickness of the Cu—Si diffusion layer is about 10 nm.

Further, an off-state current and an on-state current in Example 8 are measured in the same way as Example 7. The results are shown in Table 2 and it is found that the TFT of Example 8 has good TFT properties comparable to the TFT of the conventional example.

Furthermore, a contact resistance is measured in the same way as Example 7 except that the nitrogen containing layer forming condition is changed to a semiconductor layer forming gas comprising $SiH_4$: 30 sccm, $PH_3$: 0.2 sccm, and $N_2$: 100 sccm [flow ratio of nitrogen gas (100 sccm)/semiconductor source gas (30 sccm+0.2 sccm)=3.3] from the case of Example 7 in order to investigate the contact resistance in Example 8. The results are shown in Table 2 and it is confirmed that the TFT of Example 7 has a good contact resistance.

Example 9

Example 9 is the case where the flow ratio of nitrogen gas/semiconductor source gas is changed to 9.9 from the case of Example 7.

More specifically, a TFT of Example 9 is manufactured in the same way as Example 7 except that the nitrogen containing layer forming condition is changed to a semiconductor layer forming gas comprising $SiH_4$: 30 sccm, $PH_3$: 0.2 sccm, and $N_2$: 300 sccm [flow ratio of nitrogen gas (300 sccm)/semiconductor source gas (30 sccm+0.2 sccm)=9.9] from the case of Example 7. The thickness of the nitrogen containing layer is about 5 nm similarly to Example 7.

With regard to the TFT obtained in Example 9, in the same way as Example 7, a section of the interface between the amorphous silicon film and the Cu alloy film after annealed for 30 min. at 300° C. is observed by TEM and analyzed by EDX and interdiffusion between Cu and Si is evaluated. As a result, it is found that Cu atoms are scarcely detected in the amorphous silicon film and the diffusion of Cu is inhibited at the upper layer of the amorphous silicon film in the same way as Example 7. Here, the thickness of the Cu—Si diffusion layer is about 10 nm.

Further, an off-state current and an on-state current in Example 9 are measured in the same way as Example 7. The results are shown in Table 2 and it is found that the TFT of Example 9 has good properties comparable to the TFT of the conventional example.

Furthermore, a contact resistance is measured in the same way as Example 7 except that the nitrogen containing layer forming condition is changed to a semiconductor layer forming gas comprising $SiH_4$: 30 sccm, $PH_3$: 0.2 sccm, and $N_2$: 300 sccm [flow ratio of nitrogen gas (300 sccm)/semiconductor source gas (30 sccm+0.2 sccm)=9.9] from the case of Example 7 in order to investigate the contact resistance in Example 9. The results are shown in Table 2 and it is confirmed that the TFT of Example 9 has a good contact resistance.

Comparative Example 2

Comparative Example 2 is the case where the flow ratio of nitrogen gas/semiconductor source gas is changed to 19.9 from the case of Example 7.

More specifically, a TFT of Comparative Example 2 is manufactured in the same way as Example 7 except that the nitrogen containing layer forming condition is changed to a semiconductor layer forming gas comprising $SiH_4$: 30 sccm, $PH_3$: 0.2 sccm, and $N_2$: 600 sccm [flow ratio of nitrogen gas (600 sccm)/semiconductor source gas (30 sccm+0.2 sccm)=19.9] from the case of Example 7. The thickness of the nitrogen containing layer is about 5 nm.

With regard to the TFT obtained in Comparative Example 2, in the same way as Example 7, a section of the interface between the amorphous silicon film and the Cu alloy film after annealed for 30 min. at 300° C. is observed by TEM and analyzed by EDX and interdiffusion between Cu and Si is evaluated. As a result, it is found that Cu atoms are scarcely detected in the amorphous silicon film and the diffusion of Cu is inhibited at the upper layer of the amorphous silicon film in the same way as Example 7. Here, the thickness of the Cu—Si diffusion layer is about 10 nm.

Further, an off-state current and an on-state current in Comparative Example 2 are measured in the same way as Example 7. The results are shown in Table 2 and it is found that the TFT of Comparative Example 2 has very deteriorated TFT properties in comparison with the conventional example and does not function as a TFT.

Furthermore, a contact resistance is measured in the same way as Example 7 except that the nitrogen containing layer forming condition is changed to a semiconductor layer forming gas comprising $SiH_4$: 30 sccm, $PH_3$: 0.2 sccm, and $N_2$: 600 sccm [flow ratio of nitrogen gas (600 sccm)/semiconductor source gas (30 sccm+0.2 sccm)=19.9] from the case of Example 7 in order to investigate the contact resistance in Comparative Example 2. The results are shown in Table 2 and the contact resistance increases.

Comparative Example 3

Comparative Example 3 is the case where the flow ratio of nitrogen gas/semiconductor source gas is changed to 0.07 from the case of Example 7.

More specifically, a TFT of Comparative Example 3 is manufactured in the same way as Example 7 except that the nitrogen containing layer forming condition is changed to a semiconductor layer forming gas comprising $SiH_4$: 150 sccm, $PH_3$: 1 sccm, and $N_2$: 10 sccm [flow ratio of nitrogen gas (10 sccm)/semiconductor source gas (150 sccm+1 sccm)=0.07] from the case of Example 7. The thickness of the nitrogen containing layer is about 4 nm.

With regard to the TFT obtained in Comparative Example 3, in the same way as Example 7, a section of the interface between the amorphous silicon film and the Cu alloy film after annealed for 30 min. at 300° C. is observed by TEM and analyzed by EDX and interdiffusion between Cu and Si is evaluated. As a result, it is confirmed that voids are observed in the Cu alloy film and the amorphous silicon film and interdiffusion occurs conspicuously between Cu and Si. Further, from semi-quantitative analysis by EDX too, diffusion of Cu into the amorphous silicon film and diffusion of Si into the Cu alloy film are confirmed.

Further, an off-state current and anon-state current in Comparative Example 3 are measured in the same way as Example 7. The results are shown in Table 2 and it is found that the TFT of Comparative Example 3 has very deteriorated TFT properties in comparison with the conventional example and does not function as a TFT.

Examples 10 to 12 and Comparative Examples 4 and 5

Examples 10 to 12 and Comparative Examples 4 and 5 are the cases where TFTs are manufactured in the same way as Examples 7 to 9 and Comparative Examples 2 and 3 respectively except that pure Cu is used instead of Cu-0.3 at. % Ni used in Examples 7 to 9 and Comparative Examples 2 and 3 respectively as the wiring material constituting a source/drain electrode (refer to Table 2). For example, Example 10 and Example 7 are the cases where TFTs are manufactured under identical conditions except that the kinds of the wiring materials are different from each other, and Comparative Example 4 and Comparative Example 2 are the cases where TFTs are manufactured under identical conditions except that the kinds of the wiring materials are different from each other. The results of the TFT properties and the contact resistances are shown in Table 2.

From Table 2, whereas good TFT properties and a good contact resistance are obtained in any of Examples 10 to 12 satisfying the requirements of the present invention, the TFT properties of Comparative Examples 4 and 5 deteriorate.

Examples 13 to 15 and Comparative Examples 6 and 7

Examples 13 to 15 and Comparative Examples 6 and 7 are the cases where TFTs are manufactured in the same way as Examples 7 to 9 and Comparative Examples 2 and 3 respectively except that Cu-0.5 at. % Mn is used instead of Cu-0.3 at. % Ni used in Examples 7 to 9 and Comparative Examples 2 and 3 respectively as the wiring material constituting a source/drain electrode (refer to Table 2). For example, Example 13 and Example 7 are the cases where TFTs are manufactured under identical conditions except that the kinds of the wiring materials are different from each other, and Comparative Example 6 and Comparative Example 2 are the cases where TFTs are manufactured under identical conditions except that the kinds of the wiring materials are different from each other. The results of the TFT properties and the contact resistances are shown in Table 2.

From Table 2, whereas good TFT properties and a good contact resistance are obtained in any of Examples 13 to 15 satisfying the requirements of the present invention, the TFT properties of Comparative Examples 6 and 7 deteriorate.

Examples 16 to 18 and Comparative Examples 8 and 9

Examples 16 to 18 and Comparative Examples 8 and 9 are the cases where TFTs are manufactured in the same way as Examples 7 to 9 and Comparative Examples 2 and 3 respectively except that Cu-0.1 at. % Ge is used instead of Cu-0.3 at. Ni % used in Examples 7 to 9 and Comparative Examples 2 and 3 respectively as the wiring material constituting a source/drain electrode (refer to Table 2). For example, Example 16 and Example 7 are the cases where TFTs are manufactured under identical conditions except that the kinds of the wiring materials are different from each other, and Comparative Example 8 and Comparative Example 2 are the cases where TFTs are manufactured under identical conditions except that the kinds of the wiring materials are different from each other. The results of the TFT properties and the contact resistances are shown in Table 2.

From Table 2, whereas good TFT properties and a good contact resistance are obtained in any of Examples 16 to 18 satisfying the requirements of the present invention, the TFT properties of Comparative Examples 8 and 9 deteriorate.

posed of pure Cu or a Cu alloy into direct contact with a semiconductor layer, the technology: being excellent in TFT properties and contact resistance between the Cu alloy film and the semiconductor layer; showing a good productivity; and further expanding a process margin. More specifically, the present invention makes it possible to provide a technology that: is hardly affected by the variations of various process conditions (variations of device performance, instability, unexpected contamination, uncontrollable contamination,

TABLE 2

| No. | Remarks | Source/drain electrode | Mixed gas flow ratio of nitrogen gas/semiconductor source gas | On-state current (A) | Off-state current (A) | Contact resistance ($\Omega \cdot cm^2$) |
|---|---|---|---|---|---|---|
| 1 | Example 7 | Cu—0.3Ni | 0.3 | $1.8 \times 10^{-6}$ | $3.2 \times 10^{-13}$ | 0.13 |
| 2 | Example 8 | Cu—0.3Ni | 3.3 | $1.7 \times 10^{-6}$ | $3.2 \times 10^{-13}$ | 0.19 |
| 3 | Example 9 | Cu—0.3Ni | 9.9 | $1.5 \times 10^{-6}$ | $3.4 \times 10^{-13}$ | 0.23 |
| 4 | Comparative Example 2 | Cu—0.3Ni | 19.9 | $4.0 \times 10^{-7}$ | $3.3 \times 10^{-13}$ | 3.1 |
| 5 | Comparative Example 3 | Cu—0.3Ni | 0.07 | $1.3 \times 10^{-6}$ | $2.3 \times 10^{-11}$ | Not evaluated |
| 6 | Example 10 | Pure Cu | 0.3 | $1.7 \times 10^{-6}$ | $3.0 \times 10^{-13}$ | 0.20 |
| 7 | Example 11 | Pure Cu | 3.3 | $1.5 \times 10^{-6}$ | $3.5 \times 10^{-13}$ | 0.18 |
| 8 | Example 12 | Pure Cu | 9.9 | $1.5 \times 10^{-6}$ | $3.2 \times 10^{-13}$ | 0.25 |
| 9 | Comparative Example 4 | Pure Cu | 19.9 | $2.6 \times 10^{-7}$ | $2.8 \times 10^{-13}$ | Not evaluated |
| 10 | Comparative Example 5 | Pure Cu | 0.07 | $1.0 \times 10^{-6}$ | $8.8 \times 10^{-11}$ | Not evaluated |
| 11 | Example 13 | Cu—0.5Mn | 0.3 | $1.7 \times 10^{-6}$ | $3.4 \times 10^{-13}$ | 0.21 |
| 12 | Example 14 | Cu—0.5Mn | 3.3 | $1.6 \times 10^{-6}$ | $3.2 \times 10^{-13}$ | 0.17 |
| 13 | Example 15 | Cu—0.5Mn | 9.9 | $1.5 \times 10^{-6}$ | $3.1 \times 10^{-13}$ | 0.22 |
| 14 | Comparative Example 6 | Cu—0.5Mn | 19.9 | $3.1 \times 10^{-7}$ | $3.8 \times 10^{-13}$ | Not evaluated |
| 15 | Comparative Example 7 | Cu—0.5Mn | 0.07 | $1.1 \times 10^{-6}$ | $4.6 \times 10^{-11}$ | Not evaluated |
| 16 | Example 16 | Cu—0.1Ge | 0.3 | $1.7 \times 10^{-6}$ | $3.3 \times 10^{-13}$ | 0.18 |
| 17 | Example 17 | Cu—0.1Ge | 3.3 | $1.6 \times 10^{-6}$ | $3.4 \times 10^{-13}$ | 0.13 |
| 18 | Example 18 | Cu—0.1Ge | 9.9 | $1.5 \times 10^{-6}$ | $3.1 \times 10^{-13}$ | 0.20 |
| 19 | Comparative Example 8 | Cu—0.1Ge | 19.9 | $4.1 \times 10^{-7}$ | $2.2 \times 10^{-13}$ | Not evaluated |
| 20 | Comparative Example 9 | Cu—0.1Ge | 0.07 | $1.1 \times 10^{-6}$ | $6.7 \times 10^{-11}$ | Not evaluated |

Meanwhile, in all the experiments of the experiment groups described above, a Cu alloy film is formed directly over a glass substrate but it does not mean that the kind of a wiring film formed directly over a glass substrate is limited to a Cu alloy film. The reason is that the wiring structure according to the present invention is characterized by a laminated structure comprising a semiconductor layer and a Cu alloy film and the other part of the structure is not particularly limited as long as the function of the present invention is not hindered. Consequently, as a wiring film formed directly over a glass substrate, a Cu alloy film may be used as stated above or an Al alloy film composed of pure Al or an Al alloy may be used for example.

Although the present invention has been explained in detail in reference to specific embodiments, it is well understood by those skilled in the art that various changes and modifications can be added without departing from the spirit and scope of the present invention.

The present invention is based on Japanese Patent Application No. 2008-174616 filed on Jul. 3, 2008 and Japanese Patent Application No. 2009-068447 filed on Mar. 19, 2009 and the contents are incorporated herein by reference in its entirety.

INDUSTRIAL APPLICABILITY

The present invention makes it possible to provide a direct contact technology capable of bringing a Cu alloy film comand others); does not require extremely severe condition control; and is hardly subjected to the restriction of process conditions.

The invention claimed is:

1. A wiring structure, comprising, in the order listed:
   a substrate;
   a semiconductor layer of amorphous silicon or polysilicon;
   a barrier layer comprising silicon nitride on the semiconductor layer;
   an amorphous silicon or polysilicon Cu diffusion layer directly on the barrier layer; and
   a Cu film comprising pure Cu or a Cu alloy in physical contact with the Cu diffusion layer.

2. The wiring structure according to claim 1, wherein the barrier layer further comprises silicon carbide.

3. The wiring structure according to claim 1, wherein the barrier layer further comprises silicon fluoride.

4. The wiring structure according to claim 1, wherein the barrier layer further comprises silicon oxynitride.

5. A method to prepare the wiring structure according to claim 1, the method comprising:
   forming the semiconductor layer comprising amorphous silicon or polysilicon on a substrate;
   forming the barrier layer comprising silicon nitride on the first semiconductor layer;

forming the semiconductor comprising amorphous silicon or polysilicon directly on the barrier layer to obtain a second semiconductor layer;

forming the Cu or Cu alloy film in physical contact with the second semiconductor layer to obtain a wiring structure laminate; and thermally treating the wiring laminate to diffuse Cu into the second semiconductor layer to obtain the Cu diffusion layer;

wherein the formation of each of the semiconductor layer, the barrier layer, the second semiconductor layer and the Cu or Cu alloy layer is continuously conducted in a same semiconductor layer forming chamber.

6. A wiring structure, comprising, in the order listed:

a substrate;

a first semiconductor layer of undoped amorphous silicon or undoped polysilicon;

a second semiconductor layer of doped amorphous silicon or doped polysilicon;

a barrier layer comprising silicon nitride on the second semiconductor layer;

an amorphous silicon or polysilicon Cu diffusion layer directly on the barrier layer; and a Cu film comprising pure Cu or a Cu alloy in physical contact with the Cu diffusion layer.

7. The wiring structure according to claim 6, further comprising a barrier layer comprising silicon nitride between the first semiconductor layer and the second semiconductor layer.

\* \* \* \* \*